US012785673B2

(12) United States Patent
Li et al.

(10) Patent No.: US 12,785,673 B2
(45) Date of Patent: Nov. 3, 2026

(54) SWITCH DRIVER CIRCUIT AND CHIP

(71) Applicant: Zhuhai Nanxin Semiconductor Technology Co., Ltd., Zhuhai City (CN)

(72) Inventors: Ziwei Li, Zhuhai City (CN); Jun Ma, Zhuhai City (CN)

(73) Assignee: Zhuhai Nanxin Semiconductor Technology Co., Ltd., Zhuhai City (CN)

( * ) Notice: Subject to any disclaimer, the term of this patent is extended or adjusted under 35 U.S.C. 154(b) by 9 days.

(21) Appl. No.: 19/070,279

(22) Filed: Mar. 4, 2025

(65) Prior Publication Data

US 2025/0286547 A1 Sep. 11, 2025

(30) Foreign Application Priority Data

Mar. 5, 2024 (CN) ........................ 202410248531.6

(51) Int. Cl.
*H03K 17/0814* (2006.01)
*H03K 17/082* (2006.01)
*H03K 17/16* (2006.01)

(52) U.S. Cl.
CPC ....... *H03K 17/0822* (2013.01); *H03K 17/165* (2013.01)

(58) Field of Classification Search
CPC ............. H03K 17/0822; H03K 17/165; H03K 17/163; H02M 1/44; H02M 1/088; H02M 1/32; H02M 3/07
See application file for complete search history.

(56) References Cited

U.S. PATENT DOCUMENTS

| | | | | |
|---|---|---|---|---|
| 6,407,594 | B1 * | 6/2002 | Milazzo | H03K 17/6877 327/377 |
| 8,497,714 | B2 * | 7/2013 | Garbossa | H02M 3/155 327/108 |
| 10,461,730 | B1 * | 10/2019 | Mariconti | H03K 17/168 |
| 2019/0028028 | A1 * | 1/2019 | Wang | H02M 3/158 |
| 2019/0074760 | A1 | 3/2019 | Hsing et al. | |
| 2020/0212909 | A1 * | 7/2020 | Ramabhadran | H02M 1/08 |
| 2021/0143814 | A1 * | 5/2021 | Xie | H03K 17/6874 |
| 2021/0305899 | A1 * | 9/2021 | Hsieh | H02M 1/0035 |
| 2024/0195287 | A1 * | 6/2024 | Chen | H02M 1/32 |

(Continued)

FOREIGN PATENT DOCUMENTS

| | | | |
|---|---|---|---|
| CN | 114337282 | A | 4/2022 |
| CN | 114598136 | A | 6/2022 |

(Continued)

*Primary Examiner* — Adam D Houston

(57) ABSTRACT

Embodiments of the present disclosure provide a switch driver circuit, and a chip. The switch driver circuit includes a driver branch and an auxiliary driver branch. The driver branch generates a control signal for the auxiliary driver branch based on a drive signal, and the auxiliary driver branch controls, based on the control signal, a to-be-driven switch to switch from a first state to a second state within a predetermined time. The switch driver circuit can control to-be-driven switches of different sizes to switch states within a predetermined time, such that the same electromagnetic interference is generated, and hence design complexity of automotive electromagnetic compatibility is lowered.

20 Claims, 14 Drawing Sheets

(56) References Cited

U.S. PATENT DOCUMENTS

| | | | | |
|---|---|---|---|---|
| 2025/0079970 | A1 * | 3/2025 | Luo | H02M 1/0025 |
| 2025/0096786 | A1 * | 3/2025 | Kong | H03K 17/04123 |
| 2025/0286547 | A1 * | 9/2025 | Li | H03K 17/0822 |
| 2026/0050283 | A1 * | 2/2026 | Lazaro | G05F 3/205 |

FOREIGN PATENT DOCUMENTS

| | | | | |
|---|---|---|---|---|
| CN | 116526811 | A | 8/2023 | |
| CN | 116886087 | A | 10/2023 | |
| WO | WO-2025007221 | A1 * | 1/2025 | H02M 1/0012 |

* cited by examiner

SWITCH DRIVER CIRCUIT AND CHIP

CROSS-REFERENCE TO RELATED APPLICATION

This application is based upon and claims the priority of Chinese Patent Application No. 202410248531.6, filed on Mar. 5, 2024, the entire contents of which are hereby incorporated by reference.

TECHNICAL FIELD

Embodiments of the present disclosure relate to the technical field of integrated circuits, and in particular, relate to a switch driver circuit, and a chip.

BACKGROUND

In the automotive field, high-side switches are widely used, and a high-side switch driver circuit is typically required to control turn-on and turn-off of the high-side switches.

Conventional high-side switch driver circuits output consistent currents in turning on high-side switches. However, high-side switches of different sizes have different gate-source capacitances and different gate-drain capacitances. The larger the size of the high-side switch, the larger the gate-source capacitance and the gate-drain capacitance, the longer of the Miller plateau time, and the longer the turn-on time and turn-off time of the high-side switch. As such, the high-side switches of different sizes exhibit different turn-on times or turn-off times under the same supply voltage, leading to variations in the oscillation amplitude and frequency introduced by parasitic inductance, which in turn causes differences in electromagnetic interference (EMI). This poses challenges to the design of automotive electromagnetic compatibility (EMC).

SUMMARY

In view of the above problem, embodiments of the present disclosure provide a switch driver circuit, a switch circuit, and a chip. With the technical solutions according to the present disclosure, states of to-be-driven switches of different sizes may be switched within a predetermined time, such that the same electromagnetic interference is generated during driving of the to-be-driven switches of different sizes, and hence design complexity of automotive electromagnetic compatibility is lowered.

In a first aspect, the embodiments of the present disclosure provide a switch driver circuit. The switch driver circuit includes a driver branch and an auxiliary driver branch. An input terminal of the driver branch is electrically connected to a drive signal, an output terminal of the driver branch is electrically connected to a control terminal of the auxiliary driver branch, an input terminal of the auxiliary driver branch is electrically connected to a predetermined voltage, and an output terminal of the auxiliary driver branch is electrically connected to a control terminal of a to-be-driven switch, wherein a first terminal of the to-be-driven switch is electrically connected to a power supply voltage, and a second terminal of the to-be-driven switch is grounded via a load.

The driver branch is configured to generate a control signal for the auxiliary driver branch based on the drive signal. The auxiliary driver branch is configured to control, based on the control signal, the to-be-driven switch to switch from a first state to a second state within a predetermined time.

In some embodiments, the auxiliary driver branch includes a turn-on auxiliary driver circuit, wherein a control terminal of the turn-on auxiliary driver circuit is electrically connected to a first output terminal of the driver branch, an input terminal of the turn-on auxiliary driver circuit is electrically connected to the predetermined voltage, and an output terminal of the turn-on auxiliary driver circuit is electrically connected to the control terminal of the to-be-driven switch.

The driver branch is configured to generate a turn-on control signal based on a turn-on drive signal. The turn-on auxiliary driver circuit is configured to control, based on the turn-on control signal, the to-be-driven switch to switch from a turned-off state to a turned-on state.

In some embodiments, the turn-on auxiliary driver circuit includes a pull-up current source, a first current source, a first capacitor, a second capacitor, a first transistor, a second transistor, a third transistor, a fourth transistor, and a first clamp assembly. The predetermined voltage is electrically connected to an input terminal of the pull-up current source, an input terminal of the first current source, a first plate of the first capacitor and a first terminal of the third transistor, an output terminal of the pull-up current source is electrically connected to a first terminal of the first transistor, an output terminal of the first current source is electrically connected to a first terminal of the second transistor, a second terminal of the second transistor is electrically connected to a first terminal of the first clamp assembly, a second plate of the first capacitor, a first plate of the second capacitor and a control terminal of the fourth transistor, a second terminal of the third transistor is electrically connected to a first terminal of the fourth transistor, a second terminal of the first transistor is electrically connected to a second terminal of the first clamp assembly, a second plate of the second capacitor, a second terminal of the fourth transistor and the control terminal of the to-be-driven switch, and a control terminal of the first transistor, a control terminal of the second transistor and a control terminal of the third transistor are electrically connected to the first output terminal of the driver branch.

In some embodiments, the auxiliary driver branch further includes a first resistor. A first terminal of the first resistor is electrically connected to the control terminal of the fourth transistor, and a second terminal of the first resistor is electrically connected to the control terminal of the to-be-driven switch.

In some embodiments, the auxiliary driver branch includes a turn-off auxiliary driver circuit. A control terminal of the turn-off auxiliary driver circuit is electrically connected to a second output terminal of the driver branch, an input terminal of the turn-off auxiliary driver circuit is electrically connected to the control terminal of the to-be-driven switch, and an output terminal of the turn-off auxiliary driver circuit is electrically connected to the second terminal of the to-be-driven switch.

The driver branch is configured to generate a turn-off control signal based on a turn-off drive signal. The turn-off auxiliary driver circuit is configured to control, based on the turn-off control signal, the to-be-driven switch to switch from a turned-on state to a turned-off state at a second predetermined time.

In some embodiments, the turn-off auxiliary driver circuit includes a pull-down current source, a second current source, a third capacitor, a fourth capacitor, a fifth transistor, a sixth transistor, a seventh transistor, an eighth transistor, and a second clamp assembly. The control terminal of the to-be-driven switch is electrically connected to a first terminal of the eighth transistor, a first plate of the third capacitor, a first terminal of the second clamp assembly and a first terminal of the fifth transistor, a second terminal of the second clamp assembly is electrically connected to a first terminal of the sixth transistor, a second plate of the third capacitor, a first plate of the fourth capacitor and a control terminal of the eighth transistor, a second terminal of the eighth transistor is electrically connected to a first terminal of the seventh transistor, a second terminal of the fifth transistor is electrically connected to an input terminal of the pull-down current source, a second terminal of the sixth transistor is electrically connected to an input terminal of the second current source, a second terminal of the seventh transistor is electrically connected to an output terminal of the pull-down current source, an output terminal of the second current source, a second plate of the fourth capacitor and a second terminal of the to-be-driven switch, and a control terminal of the fifth transistor, a control terminal of the sixth transistor and a control terminal of the seventh transistor are electrically connected to the second output terminal of the driver branch.

In some embodiments, the auxiliary driver branch further includes a second resistor. A first terminal of the second resistor is electrically connected to the control terminal of the to-be-driven switch, and a second terminal of the second resistor is electrically connected to the control terminal of the eighth transistor.

In some embodiments, the auxiliary driver branch further includes a pull-down circuit. A first input terminal of the pull-down circuit is electrically connected to the control terminal of the to-be-driven switch, a second input terminal of the pull-down circuit is electrically connected to the control terminal of the fourth transistor, an output terminal of the pull-down circuit is electrically connected to the second terminal of the to-be-driven switch, and a control terminal of the pull-down circuit is electrically connected to the second output terminal of the driver branch.

The pull-down circuit is configured to, based on the turn-off control signal, electrically connect the control terminal of the to-be-driven switch to the second terminal of the to-be-driven switch, and meanwhile electrically connect the control terminal of the fourth transistor to the second terminal of the to-be-driven switch.

In some embodiments, the pull-down circuit includes a ninth transistor and a tenth transistor. A first terminal of the ninth transistor is electrically connected to the control terminal of the to-be-driven switch, a first terminal of the tenth transistor is electrically connected to the control terminal of the fourth transistor, a second terminal of the ninth transistor and a second terminal of the tenth transistor are both electrically connected to the second terminal of the to-be-driven switch, and a control terminal of the tenth transistor and a control terminal of the ninth transistor are both electrically connected to the second output terminal of the driver branch.

In some embodiments, the auxiliary driver branch further includes a protection circuit; wherein a first input terminal of the protection circuit is electrically connected to the predetermined voltage, a second input terminal of the protection circuit is electrically connected to the power supply voltage, a third input terminal of the protection circuit is electrically connected to the control terminal of the to-be-driven switch, a fourth input terminal of the protection circuit is electrically connected to the control terminal of the fourth transistor, a control terminal of the protection circuit is electrically connected to a third output terminal of the driver branch, and an output terminal of the protection circuit is electrically connected to the second terminal of the to-be-driven switch.

The protection circuit is configured to control the to-be-driven switch to be constantly in the turned-off state in response to a jump of the power supply voltage and/or the predetermined voltage.

In some embodiments, the protection circuit includes a third resistor, a fourth resistor, a fifth resistor, an eleventh transistor, a twelfth transistor, and a thirteenth transistor, a fifth capacitor, and a third clamp assembly. A control terminal of the eleventh transistor is electrically connected to the third output terminal of the driver branch and a first terminal of the third resistor, a first terminal of the eleventh transistor is electrically connected to a first plate of the fifth capacitor, a first terminal of the third clamp assembly, a first terminal of the fourth resistor, a first terminal of the fifth resistor, a control terminal of the twelfth transistor and a control terminal of the thirteenth transistor, a first terminal of the twelfth transistor is electrically connected to a control terminal of the fourth transistor, a first terminal of the thirteenth transistor is electrically connected to the control terminal of the to-be-driven switch, a second terminal of the fourth resistor is electrically connected to the predetermined voltage, and a second terminal of the fifth resistor is electrically connected to the power supply voltage.

A second terminal of the third resistor is electrically connected to a second terminal of the eleventh transistor, a second plate of the fifth capacitor, a second terminal of the third clamp assembly, a second terminal of the twelfth transistor, a second terminal of the thirteenth transistor and the second terminal of the to-be-driven switch.

In some embodiments, the auxiliary driver branch further includes a first clamp circuit and a second clamp circuit. An input terminal of the first clamp circuit is electrically connected to the control terminal of the fourth transistor, an input terminal of the second clamp circuit is electrically connected to the control terminal of the to-be-driven switch, and an output terminal of the first clamp circuit and an output terminal of the second clamp circuit are both electrically connected to the second terminal of the to-be-driven switch.

The first clamp circuit is configured to clamp a voltage between the control terminal of the fourth transistor and the second terminal of the to-be-driven switch in a case where a voltage of the load is less than the predetermined voltage. The second clamp circuit is configured to clamp a voltage between the control terminal of the to-be-driven switch and the second terminal of the to-be-driven switch in a case where the voltage of the load is less than the predetermined voltage.

In some embodiments, the first clamp circuit includes a fourth clamp assembly and a sixth resistor. A first terminal of the fourth clamp assembly is electrically connected to the control terminal of the fourth transistor, a second terminal of the fourth clamp assembly is electrically connected to a first terminal of the sixth resistor, and a second terminal of the sixth resistor is electrically connected to the second terminal of the to-be-driven switch.

The second clamp circuit includes a fifth clamp assembly and a seventh resistor. A first terminal of the fifth clamp assembly is electrically connected to the control terminal of the to-be-driven switch, a second terminal of the fifth clamp assembly is electrically connected to a first terminal of the seventh resistor, and a second terminal of the seventh resistor is electrically connected to the second terminal of the to-be-driven switch.

In some embodiments, the auxiliary driver branch includes a pull-up circuit and a turn-off auxiliary driver circuit. The turn-off auxiliary driver circuit includes a pull-down current source, a second current source, a third capacitor, a fourth capacitor, a fifth transistor, a sixth transistor, a seventh transistor, an eighth transistor, and a second clamp assembly.

The control terminal of the to-be-driven switch is electrically connected to a first terminal of the eighth transistor, a first plate of the third capacitor, a first terminal of the second clamp assembly, a first terminal of the fifth transistor and a first output terminal of the pull-up circuit, a second terminal of the second clamp assembly is electrically connected to a first terminal of the sixth transistor, a second plate of the third capacitor, a first plate of the fourth capacitor, a control terminal of the eighth transistor and a second output terminal of the pull-up circuit, a second terminal of the eighth transistor is electrically connected to a first terminal of the seventh transistor, a second terminal of the fifth transistor is electrically connected to an input terminal of the pull-down current source, a second terminal of the sixth transistor is electrically connected to an input terminal of the second current source, a second terminal of the seventh transistor is electrically connected to an output terminal of the pull-down current source, an output terminal of the second current source, a second plate of the fourth capacitor, and the second terminal of the to-be-driven switch, a control terminal of the pull-up circuit is electrically connected to a first output terminal of the driver circuit, and an input terminal of the pull-up circuit is electrically connected to the predetermined voltage.

The driver branch is configured to generate a turn-off control signal based on a turn-off drive signal, and generate a turn-on control signal based on a turn-on drive signal. The turn-off auxiliary driver circuit is configured to control, based on the turn-off control signal, the to-be-driven switch to switch from a turned-on state to a turned-off state at a second predetermined time. The pull-up circuit is configured to electrically connect, based on the turn-on control signal, the control terminal of the to-be-driven switch to the predetermined voltage, and meanwhile electrically connect the control terminal of the eighth transistor to the predetermined voltage.

In some embodiments, the pull-down circuit includes a fourteenth transistor and a fifteenth transistor. The predetermined voltage is electrically connected to a first terminal of the fourteenth transistor and a first terminal of the fifteenth transistor, a second terminal of the fourteenth transistor is electrically connected to the control terminal of the to-be-driven switch, a second terminal of the fifteenth transistor is electrically connected to the control terminal of the eighth transistor, and a control terminal of the fourteenth transistor and a control terminal of the fifteenth transistor are both electrically connected to the first output terminal of the driver branch.

In some embodiments, the driver branch includes a first level converter, a second level converter, a rising edge delayer, a falling edge delayer, a first inverter, and a second inverter. An input terminal of the first level converter and an input terminal of the second level converter are electrically connected to the drive signal, an output terminal of the first level converter is electrically connected to an input terminal of the rising edge delayer, an output terminal of the second level converter is electrically connected to an input terminal of the falling edge delayer, an output terminal of the rising edge delayer is electrically connected to an input terminal of the first inverter, an output terminal of the falling edge delayer is electrically connected to an input terminal of the second inverter, an output terminal of the first inverter is electrically connected to a first output terminal of the driver branch, and an output terminal of the second inverter is electrically connected to a second output terminal of the driver branch.

In some embodiments, the switch driver circuit further includes a floating power supply branch. An input terminal of the floating power supply branch is electrically connected to the predetermined voltage, and a ground terminal of the floating power supply branch is electrically connected to the second terminal of the to-be-driven switch.

The floating power supply branch is configured to provide a floating power supply to the driver branch.

In some embodiments, the floating power supply branch includes a third current source, a sixth clamp assembly, a sixth capacitor, a sixteenth transistor, and a first enable switch. The predetermined voltage is electrically connected to an input terminal of the third current source and a first terminal of the sixteenth transistor, an output terminal of the third current source is electrically connected to a first terminal of the first enable switch, a second terminal of the first enable switch is electrically connected to a control terminal of the sixteenth transistor, a first terminal of the sixth clamp assembly and a first plate of the sixth capacitor, a second terminal of the sixteenth transistor is electrically connected to a power terminal of the falling edge delayer and a power terminal of the second inverter, and a second terminal of the sixth clamp assembly is electrically connected to a second plate of the sixth capacitor, the falling edge delayer, a ground terminal of the second inverter and the second terminal of the to-be-driven switch.

In some embodiments, the switch driver circuit further includes a floating ground branch; wherein an input terminal of the floating ground branch is electrically connected to the predetermined voltage, and a ground terminal of the floating ground branch is grounded.

The floating ground branch is configured to provide a floating ground to the driver branch.

In some embodiments, the floating ground branch includes a fourth current source, a seventh clamp assembly, a seventh capacitor, a seventeenth transistor, and a second enable switch. The predetermined voltage is electrically connected to a first terminal of the seventh clamp assembly, a first plate of the seventh capacitor, a power terminal of the rising edge delayer and a power terminal of the first inverter, a second terminal of the seventh clamp assembly is electrically connected to a second plate of the seventh capacitor, a control terminal of the seventeenth transistor and a first terminal of the second enable switch, a second terminal of the second enable switch is electrically connected to an input terminal of the fourth current source, a first terminal of the seventeenth transistor is electrically connected to a ground terminal of the rising edge delayer and a ground terminal of the first inverter, and an output terminal of the seventeenth transistor and an output terminal of the fourth current source are both grounded.

In some embodiments, the switch driver circuit further includes a boost circuit. An input terminal of the boost circuit is electrically connected to the power supply voltage, and an output terminal of the boost circuit is electrically connected to the input terminal of the auxiliary driver branch.

The boost branch is configured to boost the power supply voltage to the predetermined voltage.

In a second aspect, the embodiments of the present disclosure provide a switch circuit. The switch circuit includes a to-be-driven switch and the switch driver circuit according to the first aspect.

In a third aspect, the embodiments of the present disclosure provide a chip. The chip includes the switch driver circuit according to the first aspect, or the switch circuit according to the second aspect.

In the technical solutions according to the embodiments of the present disclosure, the switch driver circuit includes a driver branch and an auxiliary driver branch. An input terminal of the driver branch is electrically connected to a drive signal, an output terminal of the driver branch is electrically connected to a control terminal of the auxiliary driver branch, an input terminal of the auxiliary driver branch is electrically connected to a predetermined voltage, and an output terminal of the auxiliary driver branch is electrically connected to a control terminal of a to-be-driven switch, wherein a first terminal of the to-be-driven switch is electrically connected to a power supply voltage, and a second terminal of the to-be-driven switch is grounded via a load. The driver branch is capable of generating a control signal for the auxiliary driver branch based on the drive signal, and the auxiliary driver branch is capable of controlling, based on the control signal, the to-be-driven switch to switch from a first state to a second state within a predetermined time. In this way, regardless of large-size or small-size to-be-driven switches, switching states thereof always requires a fixed time. Therefore, the switch driver circuit is capable of controlling to-be-driven switches of different sizes to switch states within a predetermined time, such that the same electromagnetic interference is generated, and hence design complexity of automotive electromagnetic compatibility is lowered.

The above description only summarizes the technical solutions of the embodiments of the present disclosure. Specific embodiments of the present disclosure are described hereinafter to better and clearer understand the technical solutions of the embodiments of the present disclosure, to practice the technical solutions based on the disclosure of the specification and to make the above and other objectives, features and advantages of the embodiments of the present disclosure more apparent and understandable.

BRIEF DESCRIPTION OF THE DRAWINGS

For clearer descriptions of technical solutions according to the embodiments of the present disclosure, drawings that are to be referred for description of the embodiments are briefly described hereinafter. Apparently, the drawings described hereinafter merely illustrate some embodiments of the present disclosure. Persons of ordinary skill in the art may also derive other drawings based on the drawings described herein without any creative effort.

DETAILED DESCRIPTION

Figure 1:
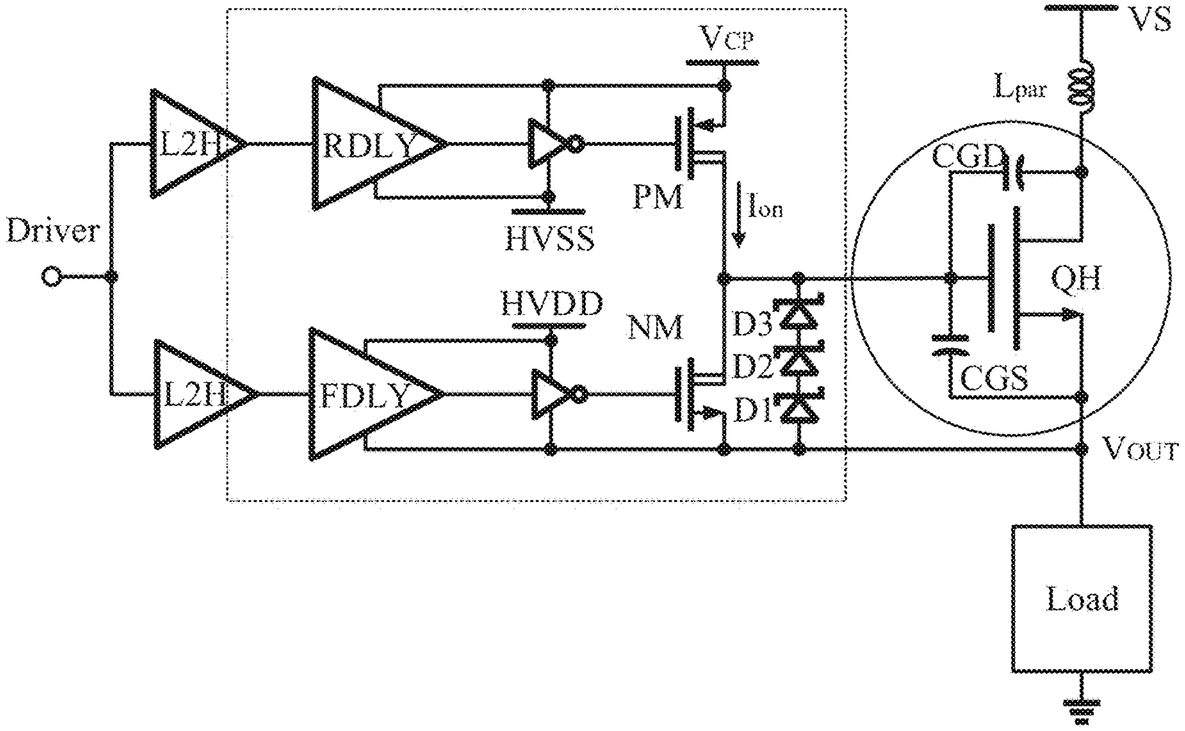
FIG. 1 (Prior art)
FIG. 1 is a schematic structural diagram of a high-side switch driver circuit in the related art.

For clearer descriptions of the objectives, technical solutions, and advantages of the embodiments of the present disclosure, the following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

Unless defined otherwise, all technical and scientific terms used herein have the same meaning as commonly understood by persons of ordinary skill in the art. The terms used herein in the specification of present disclosure are only intended to illustrate the specific embodiments of the present disclosure, instead of limiting the present disclosure. The terms "comprise," "include," and any variations thereof in the specification, claims, and the description of the drawings of the present disclosure are intended to cover a non-exclusive inclusion.

The terms "example" and "embodiment" in this specification signify that the specific characteristic, structures or features described with reference to the embodiments may be covered in at least one embodiment of the present disclosure. The term "embodiment," when used in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

Terms such as "first," "second," and the like in the specifications, claims and the accompanying drawings of the present disclosure are intended to distinguish different objects but are not intended to define a specific sequence. Such terms may explicitly or implicitly indicate one or more such features.

In the description of the present disclosure, unless otherwise explicitly specified and defined, the terms "connected," "coupled," and derivatives forms thereof shall be understood in a broad sense. For example, the terms "connected," "coupled," and derivatives form thereof for depicting the circuit structure, in addition to physical connection, may also be understood as electrical connections or signal connection. The connection, for example, may be direct connection, i.e., the physical connection or, indirect connection via at least one intermediate element as long as the circuit is conducted, or communication between the interiors of two elements. The signal connection, in addition to signal connection via a circuitry, may also be signal connection via a communication medium, for example, radio waves.

The term "and/or" is merely an association relationship for describing associated objects, which represents that there may exist three types of relationships, for example, A and/or B may represent three situations: only A exists, both A and B exist, and only B exists. In addition, the forward-slash symbol "/" generally represents an "or" relationship between associated objects before and after the symbol.

In the description of the embodiments of the present disclosure, the terms "a plurality of" and "at least two" signify two or more, unless otherwise specified. Likewise, the terms "a plurality of groups" and "at least two groups" signify two or more groups (including two groups).

To make a person skilled in the art better understand the technical solutions of the embodiments of the present disclosure, the technical solutions of the present disclosure are clearly and completely described with reference to the accompanying drawings of the embodiments of the present disclosure.

FIG. 1 is a schematic structural diagram of a high-side switch driver circuit in the related art. As illustrated in FIG. 1, the high-side switch driver circuit includes a transistor NM, a transistor PM, two level converter L2H, a rising edge delayer RDLY, a falling edge delayer FDLY, and two inverters.

The transistor NM is an N-lateral diffused metal-oxide semiconductor (NLDMOS) transistor, and the transistor PM is a P-lateral diffused metal-oxide semiconductor (PNLDMOS) transistor. As illustrated in FIG. 1, HVDD represents a floating power supply, and $V_{OUT}+3 \leq HVDD \leq V_{OUT}+5$, wherein $V_{OUT}$ represents a voltage of the load. HVSS represents a floating ground, and $V_{CP}-5 \leq HVSS \leq V_{CP}-3$, wherein $V_{CP}$ represents a predetermined voltage.

The high-side switch driver circuit converts a drive signal Driver for controlling one high-side switch QH into a $V_{CP}$–HVSS voltage domain via one level converter L2H, and then acquires a control signal of the transistor PM by processing the drive signal Driver via the rising edge delayer RDLY and one inverter. The high-side switch driver circuit converts the drive signal Driver for controlling the high-side switch QH into an HVDD-$V_{OUT}$ voltage domain via another level converter L2H, and then acquires a control signal of the transistor NM by processing the drive signal Driver via the falling edge delayer FDLY and another inverter. The rising edge delayer RDLY and the falling edge delayer FDLY ensure that the transistor PM and the transistor NM are not turned on simultaneously.

Still referring to FIG. 1, the high-side switch driver circuit further includes three Zener diodes, that is, a Zener diode D1, a Zener diode D2, and a Zener diode D3. These three Zener diodes are clamp Zener diodes of the high-side switches QH, which ensure that gate-source voltages of the high-side switches QH do not exceed breakdown voltages of the three Zener diodes, for example, 15 V.

Figure 2A:
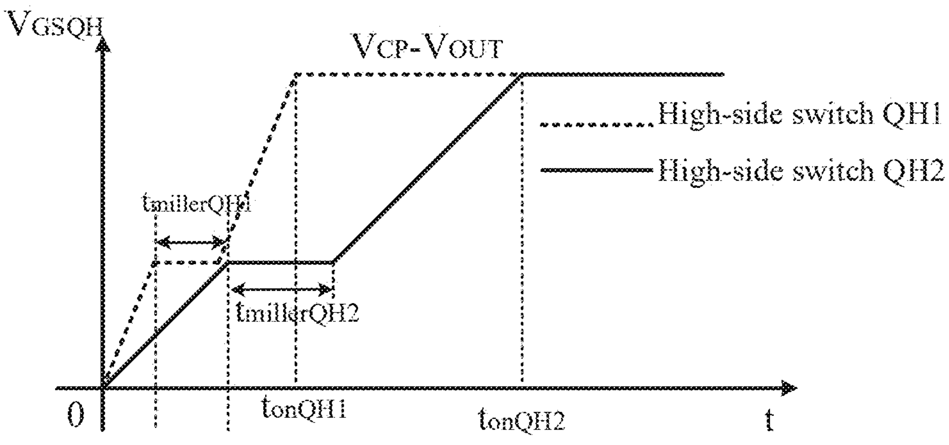
FIG. 2A (Prior art)
FIG. 2A is a schematic diagram of gate-source voltages of high-side switches of different sizes in the related art.

The high-side switch driver circuit as illustrated in FIG. 1 may drive high-side switches QH of different sizes. For example, the high-side switch driver circuit may respectively drive a high-side switch QH1 and a high-side switch QH2, wherein the size of the high-side QH1 is less than the size of the high-side switch QH2. FIG. 2A is a schematic diagram of gate-source voltages of high-side switches of different sizes in the related art; and FIG. 2B is a schematic diagram of currents flowing through high-side switches of different sizes in the related art.

For example, although the size of the high-side switch QH1 is different from the size of the high-side switch QH2, the high-side switch driver circuit outputs consistent currents in turning on the high-side switch QH1 and the high-side switch QH2. Since the size of the high-side switch QH1 is less than the size of the high-side switch QH2, a capacitance value $C_{GS1}$ of a gate-source capacitor CGS1 of the high-side switch QH1 is less than a capacitance value $C_{GS2}$ of a gate-source capacitor CGS2 of the high-side switch QH2, that is, $C_{GS1}<C_{GS2}$, and a capacitance value $C_{GD1}$ of a gate-drain capacitor CGD1 of the high-side switch QH1 is less than a capacitance value $C_{GD1}$ of a gate-drain capacitance CGD2 of the high-side switch QH2, that is, $C_{GD1}<C_{GD2}$.

As illustrated in FIG. 2A, a Miller plateau time $T_{millerQH1}$ of the high-side switch QH1 is $C_{GD1}VS/I_{on}$, and a Miller plateau time $T_{millerQH2}$ of the high-side switch QH2 is $C_{GD2}VS/I_{on}$. Apparently, $t_{millerQH1}<t_{millerQH2}$. Therefore, a turn-on time $t_{onQH1}$ for the high-side switch QH1 is shorter than a turn-on time $t_{onQH2}$ for the high-side switch QH2.

Figure 2B:
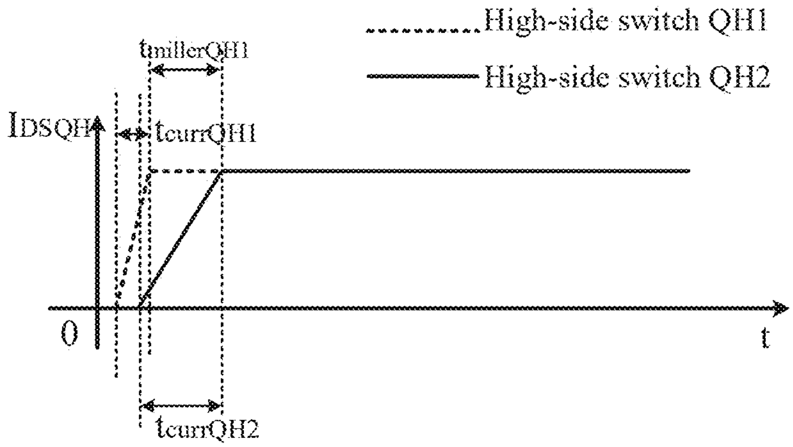
FIG. 2B (Prior art)
FIG. 2B is a schematic diagram of currents flowing through high-side switches of different sizes in the related art.

Further, as illustrated in FIG. 2B, a rising time $t_{currQH1}$ of a current $I_{DSQH1}$ flowing through the high-side switch QH1 is shorter than a rising time $t_{currQH2}$ of a current $I_{DSQH2}$ flowing through the high-side switch QH2. Therefore, under a same power supply voltage VS, in a process that the conventional high-side switch driver circuit controls the high-side switches QH of different sizes to be turned on, rates of change dv/dt over time of gate-source voltages $V_{GSQH}$ of the high-side switches QH are different, and rates of change di/dt over time of currents $I_{DSQH}$ flowing through the high-side switches QH are also different. This may result in different turn-on times of the high-side switches QH of different sizes under the same power supply voltage VS.

Likewise, under the same power supply voltage VS, in the process that the conventional high-side switch driver circuit controls the high-side switches QH of different sizes to be turned off, the rates of change dv/dt over time of the gate-source voltages $V_{GSQH}$ of the high-side switches QH are different, and the rates of change di/dt over time of the currents $I_{DSQH}$ flowing through the high-side switches QH are also different. This may result in different turn-off times of the high-side switches QH of different sizes under the same power supply voltage VS.

Thus, under the same power supply voltage VS, in the process that the conventional high-side switch driver circuit controls the high-side switches QH of different sizes, since the turn-on times and the turn-off times of the high-side switches QH of different sizes are all different, a parasitic inductor Lpar may introduce different oscillation amplitudes and frequencies, the greater oscillation amplitudes may affect the voltage withstand design for the system, and may inadvertently trigger voltage or current protection circuits. Additionally, for the high-side switches QH of different sizes, the electromagnetic interference (EMI) of the high-side switch driver circuit also varies. The high-side switch driver circuit is typically applied in the automotive fields, which thus increases the difficulty of designing for automotive electromagnetic compatibility (EMC).

Accordingly, some embodiments of the present disclosure provide a switch driver circuit. The switch driver circuit includes a driver branch and an auxiliary driver branch. An input terminal of the driver branch is electrically connected to a drive signal, an output terminal of the driver branch is electrically connected to a control terminal of the auxiliary driver branch, an input terminal of the auxiliary driver branch is electrically connected to a predetermined voltage, and an output terminal of the auxiliary driver branch is electrically connected to a control terminal of a to-be-driven switch, wherein a first terminal of the to-be-driven switch is electrically connected to a power supply voltage, and a second terminal of the to-be-driven switch is grounded via a load. The driver branch is configured to generate a control signal for the auxiliary driver branch based on the drive signal, and the auxiliary driver branch is configured to control, based on the control signal, the to-be-driven switch to switch from a first state to a second state within a predetermined time. In this way, regardless of large-size or small-size to-be-driven switches, switching states thereof always requires a fixed time. Therefore, the switch driver circuit is configured to control to-be-driven switches of different sizes to switch states within a predetermined time, such that the same electromagnetic interference is generated, and hence design complexity of automotive electromagnetic compatibility is lowered.

The technical solutions according to the present disclosure are described in great detail hereinafter with reference to some specific embodiments.

Figure 3:
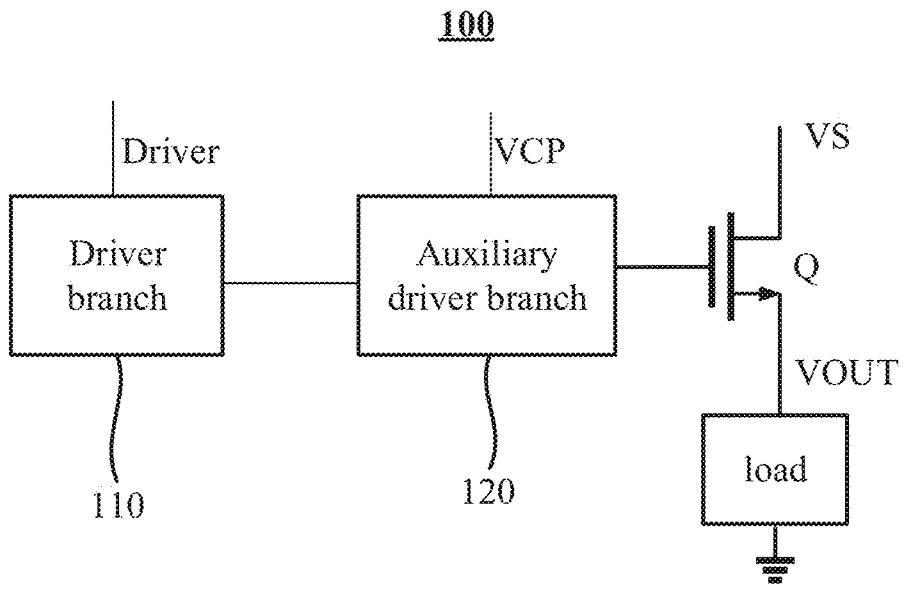
FIG. 3 is a schematic structural diagram of a switch driver circuit according to some embodiments of the present disclosure.

FIG. 3 is a schematic structural diagram of a switch driver circuit 100 according to some embodiments of the present disclosure. As illustrated in FIG. 3, the switch driver circuit 100 includes a driver branch 110 and an auxiliary driver branch 120. An input terminal of the driver branch 110 is electrically connected to a drive signal Driver, an output terminal of the driver branch 110 is electrically connected to a control terminal of the auxiliary driver branch 120, an input terminal of the auxiliary driver branch 120 is electrically connected to a predetermined voltage $V_{CP}$, and an output terminal of the auxiliary driver branch 120 is electrically connected to a control terminal of a to-be-driven switch Q, wherein a first terminal of the to-be-driven switch Q is electrically connected to the power supply voltage VS, and a second terminal of the to-be-driven switch Q is grounded via a load.

For example, the to-be-driven switch Q may be an N-type MOS transistor, the control terminal of the to-be-driven switch Q is a gate G, the first terminal of the to-be-driven switch Q is a drain D, and a second terminal of the to-be-driven switch Q is a source S.

The driver branch 110 is configured to generate a control signal for the auxiliary driver branch 120 based on the drive signal Driver, and the auxiliary driver branch 120 is configured to control, based on the control signal, the to-be-driven switch Q to switch from a first state to a second state within a predetermined time.

For example, the drive signal Driver may be a turn-on drive signal Driver_on for controlling the to-be-driven switch Q to be turned on, or may be a turn-off drive signal Driver_off for controlling the to-be-driven switch Q to be turned off. For example, the turn-on drive signal Driver_on is 0, and the turn-off drive signal Driver_off is 1; or, the turn-on drive signal Driver_on is 1, and the turn-off drive signal Driver_off is 0.

The control signal may be a turn-on control signal Driver_on_z1, or may include a turn-on control signal Driver_on_z1 and an auxiliary turn-on control signal Driver_on_z2, or may be a turn-off control signal Driver_off_z1, or may include a turn-off control signal Driver_off_z1 and an auxiliary turn-off control signal Driver_off_z2. For example, in a case where the drive signal Driver is a turn-on drive signal Driver_on, the driver branch 110 may generate a turn-on control signal Driver_on_z1 for the auxiliary driver branch 120, or generate both a turn-on control signal Driver_on_z1 and an auxiliary turn-on control signal Driver_on_z2 for the auxiliary driver branch 120. For example, in a case where the drive signal Driver is a turn-off drive signal Driver_off, the driver branch 110 may generate a turn-off control signal Driver_off_z1 for the auxiliary driver branch 120, or generate both a turn-off control signal Driver_off_z1 and an auxiliary turn-off control signal Driver_off_z2 for the auxiliary driver branch 120.

The first state is a turned-on state, and correspondingly the second state is a turned-off state; or, the first state is a turned-off state, and correspondingly the second state is a turned-on state. The auxiliary driver branch 120 may control, based on the turned-on control signal Driver_on_z1, the to-be-driven switch Q to switch from the turned-off state to the turned-on state; or may control, based on the turn-off control signal Driver_off_z1, the to-be-driven switch Q to switch from the turned-on state to the turned-off state; or control, based on the turn-on control signal Driver_on_z1 and the auxiliary turn-on control signal Driver_on_z2, the to-be-driven switch Q to switch from the turned-off state to the turned-on state; or may control, based on the auxiliary turn-off control signal Driver_off_z2 and the turn-off control signal Driver_off_z1, the to-be-driven switch Q to switch from the turned-on state to the turned-off state.

Figure 4:
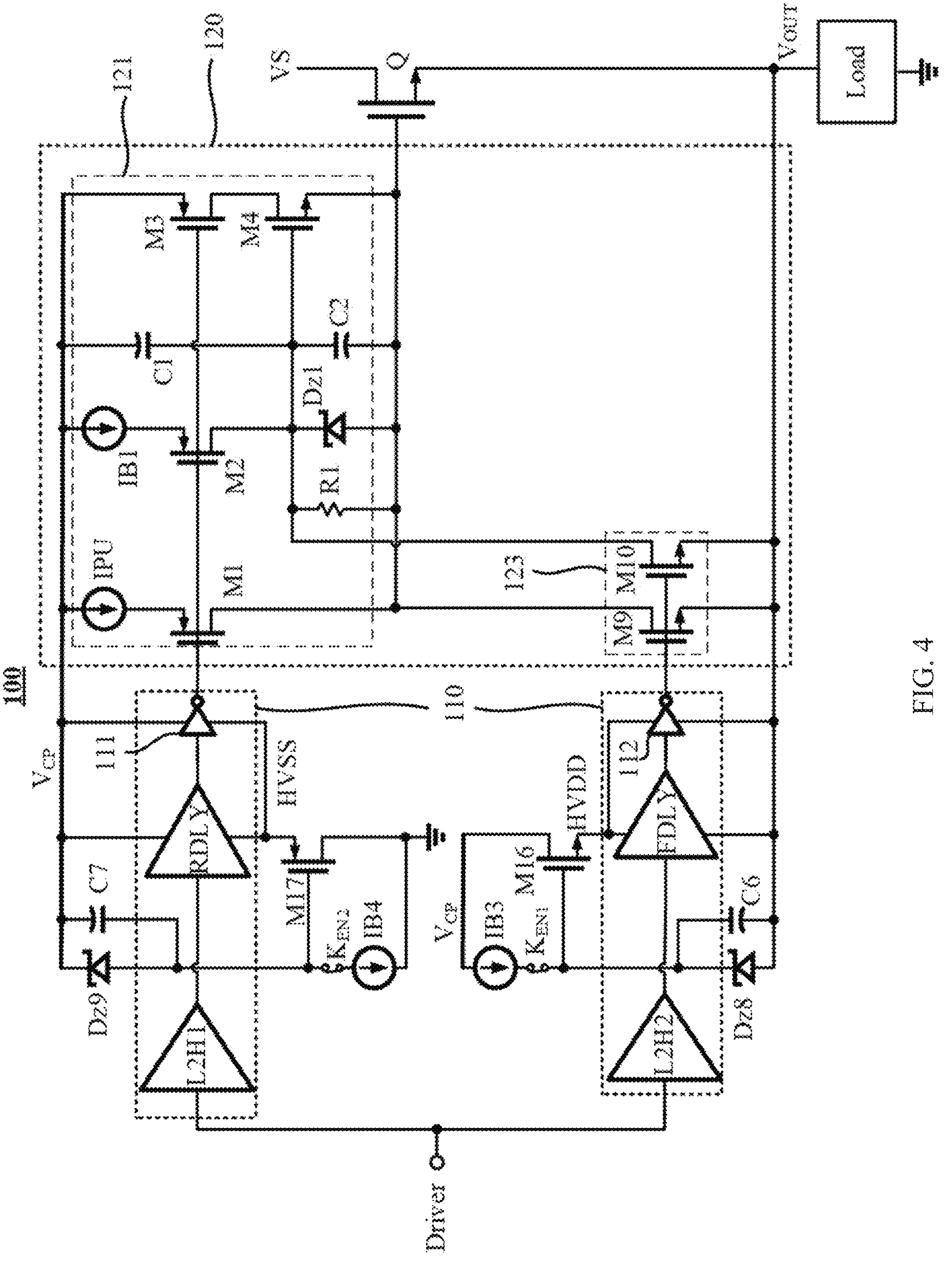
FIG. 4 is a schematic structural diagram of a switch driver circuit according to some embodiments of the present disclosure.

In some embodiments, FIG. 4 is a schematic structural diagram of a switch driver circuit according to some embodiments of the present disclosure. As illustrated in FIG. 4, based on the embodiments illustrated in FIG. 3, the auxiliary driver branch 120 includes a turn-on auxiliary driver circuit 121, wherein a control terminal of the turn-on auxiliary driver circuit 121 is electrically connected to a first output terminal of the driver branch 110, an input terminal of the turn-on auxiliary driver circuit 121 is electrically connected to the predetermined voltage $V_{CP}$, and an output terminal of the turn-on auxiliary driver circuit 121 is electrically connected to the control terminal of the to-be-driven switch Q.

Specifically, in a case where the to-be-driven switch Q is in the turned-off state, the driver branch 110 receives a turn-on drive signal Driver_on, generates a turn-on control signal Driver_on_z1 based on the turn-on drive signal Driver_on, and transmits the turn-on control signal Driver_on_z1 to the control terminal of the turn-on auxiliary driver circuit 121 via the first output terminal thereof. The turn-on auxiliary driver circuit 121 controls, based on the received turn-on control signal Driver_on_z1, the predetermined voltage $V_{CP}$ to be electrically connected to the control terminal of the to-be-driven switch Q within a first predetermined time. A control voltage of the to-be-driven switch Q is the predetermined voltage $V_{CP}$, and under the effect of the control voltage $V_{CP}$, the to-be-driven switch Q switches from the turned-off state to the turned-on state.

In this way, the auxiliary driver branch 120 may control, based on the turn-on control signal Driver_on_z1, the to-be-driven switch Q to switch from the turned-off state to the turned-on state within the first predetermined time. Apparently, no matter whether the to-be-driven switch Q has a large size or a small size, the turn-on time for the to-be-driven switch Q is fixed. Therefore, the switch driver circuit 100 is capable of controlling to-be-driven switches Q of different sizes to be turned on within a predetermined turn-on time, such that the same electromagnetic interference is generated, and hence design complexity of automotive electromagnetic compatibility is lowered.

Figure 5:
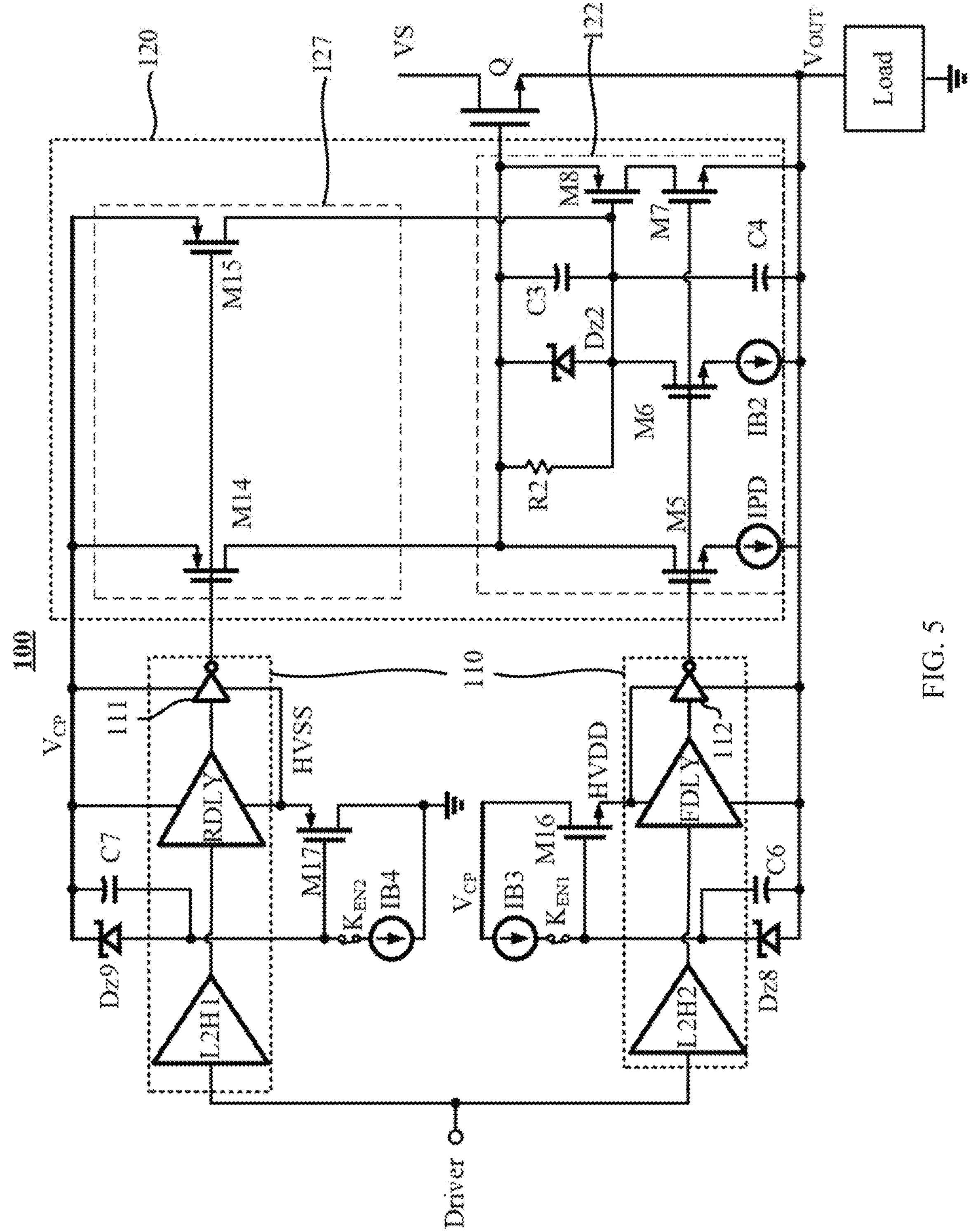
FIG. 5 is a schematic structural diagram of a switch driver circuit according to some embodiments of the present disclosure.

In some other embodiments, FIG. 5 is a schematic structural diagram of a switch driver circuit according to some embodiments of the present disclosure. As illustrated in FIG. 5, based on the embodiments illustrated in FIG. 3, the auxiliary driver branch 120 further includes a turn-off auxiliary driver circuit 122, wherein a control terminal of the turn-off auxiliary driver circuit 122 is electrically connected to a second output terminal of the driver branch 110, an input terminal of the turn-off auxiliary driver circuit 122 is electrically connected to the control terminal of the to-be-driven switch Q, and an output terminal of the turn-off auxiliary driver circuit 122 is electrically connected to the second terminal of the to-be-driven switch Q.

Specifically, in a case where the to-be-driven switch Q is in the turned-on state, the driver branch 110 receives a turn-off drive signal Driver_off, generates a turn-off control signal Driver_off_z1 based on the turn-off drive signal Driver_off, and transmits the turn-off control signal Driver_off_z1 to the control terminal of the turn-off auxiliary driver circuit 122 via the second output terminal thereof. The turn-off auxiliary driver circuit 122 controls, based on the received turn-off control signal Driver_off_z1, the second terminal of the to-be-driven switch Q to be electrically connected to the control terminal of the to-be-driven switch Q within a second predetermined time. In this case, the to-be-driven switch Q switches from the turned-on state to the turned-off state.

The auxiliary driver branch 120 may control, based on the turn-off control signal Driver_off_z1, the to-be-driven switch Q to switch from a turned-on state to a turned-off state within the second predetermined time. Apparently, no matter whether the to-be-driven switch Q has a large size or a small size, the turn-off time of the to-be-driven switch Q is fixed. Therefore, the switch driver circuit 100 is capable of controlling to-be-driven switches Q of different sizes to be turned off within a predetermined turn-off time, such that the same electromagnetic interference is generated, and hence design complexity of automotive electromagnetic compatibility is lowered.

Figure 6:
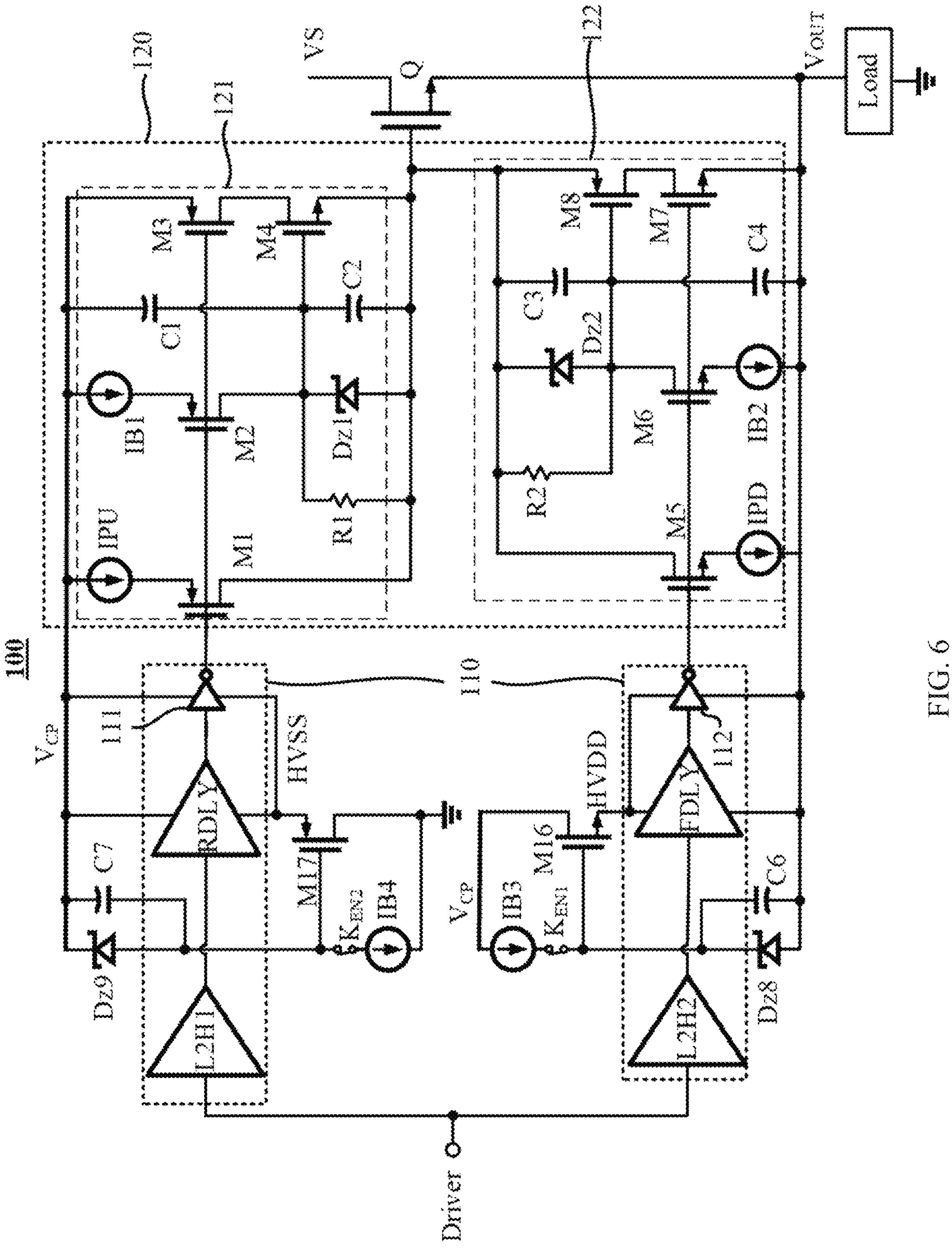
FIG. 6 is a schematic structural diagram of a switch driver circuit according to some embodiments of the present disclosure.

In some other embodiments, FIG. 6 is a schematic structural diagram of a switch driver circuit according to some embodiments of the present disclosure. As illustrated in FIG. 6, based on the embodiments illustrated in FIG. 3, the auxiliary driver circuit 120 further includes a turn-on auxiliary driver circuit 121 and a turn-off auxiliary driver circuit 122. A control terminal of the turn-on auxiliary driver circuit 121 is electrically connected to the first output terminal of the driver branch 110, a control terminal of the turn-off auxiliary driver circuit 122 is electrically connected to the second output terminal of the driver branch 110, an input terminal of the turn-on auxiliary driver circuit 121 is electrically connected to the predetermined voltage $V_{CP}$, an input terminal of the turn-off auxiliary driver circuit 122 and an output terminal of the turn-on auxiliary driver circuit 121 are both electrically connected to the control terminal of the to-be-driven switch Q, and an output terminal of the turn-off auxiliary driver circuit 122 is electrically connected to the second terminal of the to-be-driven switch Q.

Specifically, in a case where the to-be-driven switch Q is in a turned-off state, upon receiving a turn-on drive signal Driver_on, the driver branch 110 may generate a turn-on control signal Driver_on_z1 based on the turn-on drive signal Driver_on, and transmit the turn-on control signal Driver_on_z1 to the control terminal of the turn-on auxiliary driver circuit 121 via the first output terminal thereof. The driver branch 110 may further generate an auxiliary turn-on control signal Driver_on_z2 based on the turn-on drive signal Driver_on, and transmit the auxiliary turn-on control signal Driver_on_z2 to the control terminal of the turn-off auxiliary driver circuit 122 via the second output terminal thereof.

The turn-on auxiliary driver circuit 121 controls, based on the received turn-on control signal Driver_on_z1, the predetermined voltage $V_{CP}$ to be electrically connected to the control terminal of the to-be-driven switch Q within a first predetermined time. The turn-off auxiliary driver circuit 122 controls, based on the received auxiliary turn-on control signal Driver_on_z2, the second terminal of the to-be-driven switch Q to be electrically disconnected from the control terminal of the to-be-driven switch Q within the first predetermined time. In this case, the control voltage of the to-be-driven switch Q is the predetermined voltage $V_{CP}$, and under the effect of the control voltage $V_{CP}$, the to-be-driven switch Q switches from the turned-off state to the turned-on state.

In a case where the to-be-driven switch Q is in the turned-on state, upon receiving a turn-off drive signal Driver_off, the driver branch 110 may generate a turn-off control signal Driver_off_z1 based on the turn-off drive signal Driver_off, and transmit the turn-off control signal Driver_off_z1 to the control terminal of the turn-off auxiliary driver circuit 122 via the second output terminal thereof. The driver branch 110 may further generate an auxiliary turn-off control signal Driver_off_z2 based on the turn-off drive signal Driver_off, and transmit the auxiliary turn-off control signal Driver_off_z2 to the control terminal of the turn-on auxiliary driver circuit 121 via the first output terminal thereof.

The turn-off auxiliary driver circuit 122 controls, based on the received turn-off control signal Driver_off_z1, the second terminal of the to-be-driven switch Q to be electrically connected to the control terminal of the to-be-driven switch Q within a second predetermined time. The turn-on auxiliary driver circuit 121 controls, based on the received auxiliary turn-off control signal Driver_off_z2, the predetermined voltage $V_{CP}$ to be electrically disconnected from the control terminal of the to-be-driven switch Q within the second predetermined time. In this case, the control voltage of the to-be-driven switch Q is a voltage at the second terminal of the to-be-driven switch Q, that is, a voltage $V_{OUT}$ of the load, and the to-be-driven switch Q switches from the turned-on state to the turned-off state.

As such, the auxiliary driver branch 120 may not only control, based on the turned-on control signal Driver_on_z1 and the auxiliary turn-on control signal Driver_on_z2, the to-be-driven switch Q to switch from the turned-off state to the turned-on state within the first predetermined time, but also control, based on the turn-off control signal Driver_off_z1 and the auxiliary turn-off control signal Driver_off_z2, the to-be-driven switch Q to switch from the turned-on state to the turned-off state within the second predetermined time. Apparently, no matter whether the to-be-driven switch Q has a large size or a small size, the turn-off time and the turn-on time for the to-be-driven switch Q are fixed. Therefore, the switch driver circuit 100 is capable of controlling to-be-driven switches Q of different sizes to be turned off within a predetermined turn-off time and turned on within a predetermined turn-on time, such that the same electromagnetic interference is generated, and hence design complexity of automotive electromagnetic compatibility is lowered.

Therefore, no matter whether the to-be-driven switch Q has a large size or a small size, the time for the to-be-driven switch Q to switch the state thereof is fixed. Therefore, the switch driver circuit is capable of controlling to-be-driven switches Q of different sizes to switch the states thereof within a predetermined time, such that the same electromagnetic interference is generated, and hence design complexity of automotive electromagnetic compatibility is lowered.

Still referring to FIG. 4 to FIG. 6, the driver branch 110 includes a first level converter L2H1, a second level converter L2H2, a rising edge delayer RDLY, a falling edge delayer FDLY, a first inverter 111, and a second inverter 112.

An input terminal of the first level converter L2H1 and an input terminal of the second level converter L2H2 are electrically connected to the drive signal Driver, an output terminal of the first level converter L2H1 is electrically connected to an input terminal of the rising edge delayer RDLY, an output terminal of the second level converter L2H2 is electrically connected to an input terminal of the falling edge delayer FDLY, an output terminal of the rising edge delayer RDLY is electrically connected to an input terminal of the first inverter 111, an output terminal of the falling edge delayer FDLY is electrically connected to an input terminal of the second inverter 112, an output terminal of the first inverter 111 is electrically connected to a first output terminal of the driver branch 110, and an output terminal of the second inverter 112 is electrically connected to a second output terminal of the driver branch 110.

The drive signal Driver is converted into a $V_{CP}$-HVSS voltage domain via the first level converter L2H1, and is then processed via the rising edge delayer RDLY and the first inverter 111 to acquire a first control signal for the auxiliary driver branch 120. The drive signal Driver is converted into an HVSS-$V_{OUT}$ voltage domain via the second level converter L2H2, and is then processed via the falling edge delayer FDLY and the second inverter 112 to acquire a second control signal for the auxiliary driver branch 120.

In a case where the drive signal Driver is a turn-on drive signal Driver_on, a first control signal acquired by processing the turn-on drive signal Driver_on via the first level converter L2H1, the rising edge delayer RDLY, and the first inverter 111 is the turn-on control signal Driver_on_z1. A second control signal acquired by processing the turn-on drive signal Driver_on via the second level converter L2H2, the falling edge delayer FDLY and the second inverter 112 is the auxiliary turn-on control signal Driver_on_z2. As such, the auxiliary driver branch 120 may control, based on the first control signal, the control terminal of the to-be-driven switch Q to be electrically connected to the predetermined voltage $V_{CP}$, and may control, based on the second control signal, the control terminal of the to-be-driven switch Q to be electrically disconnected from the second terminal of the to-be-driven switch Q, such that mis-turn off of the to-be-driven switch Q is prevented.

In a case where the drive signal Driver is a turn-off drive signal Driver_off, a first control signal acquired by processing the turn-off drive signal Driver_off via the first level converter L2H1, the rising edge delayer RDLY, and the first inverter 111 is the auxiliary turn-off control signal Driver_on_z2. A second control signal acquired by processing the turn-off drive signal Driver_off via the second level converter L2H2, the falling edge delayer FDLY and the second inverter 112 is the turn-off control signal Driver_off_z1. As such, the auxiliary driver branch 120 may control, based on the first control signal, the control terminal of the to-be-driven switch Q to be electrically disconnected from the predetermined voltage $V_{CP}$, and may control, based on the second control signal, the control terminal of the to-be-driven switch Q to be electrically connected to the second terminal of the to-be-driven switch Q, such that mis-turn on of the to-be-driven switch Q is prevented.

Therefore, the control terminal of the to-be-driven switch Q may not be simultaneously electrically connected to the second terminal of the to-be-driven switch Q and the predetermined voltage $V_{CP}$, such that mis-turn on and mis-turn off of the to-be-driven switch Q are both prevented.

In some embodiments, still referring to FIG. 4 and FIG. 6, the turn-on auxiliary driver circuit 121 includes a pull-up current source IPU, a first current source IB1, a first capacitor C1, a second capacitor C2, a first transistor M1, a second transistor M2, a third transistor M3, a fourth transistor M4, and a first clamp assembly.

The predetermined voltage $V_{CP}$ is electrically connected to an input terminal of the pull-up current source IPU, an input terminal of the first current source IB1, a first plate of the first capacitor C1 and a first terminal of the third transistor M3, an output terminal of the pull-up current source IPU is electrically connected to a first terminal of the first transistor M1, an output terminal of the first current source IB1 is electrically connected to a first terminal of the second transistor M2, a second terminal of the second transistor M2 is electrically connected to a first terminal of the first clamp assembly, a second plate of the first capacitor C1, a first plate of the second capacitor C2 and a control terminal of the fourth transistor M4, a second terminal of the third transistor M3 is electrically connected to a first terminal of the fourth transistor M4, a second terminal of the first transistor M1 is electrically connected to a second terminal of the first clamp assembly, a second plate of the second capacitor C2, a second terminal of the fourth transistor M4 and the control terminal of the to-be-driven switch Q, and a control terminal of the first transistor M1, a control terminal of the second transistor M2 and a control terminal of the third transistor M3 are all electrically connected to the first output terminal of the driver branch 110.

Specifically, as illustrated in FIG. 4 and FIG. 6, the first transistor M1, the second transistor M2 and the third transistor M3 are all P-type MOS transistors, and the fourth transistor M4 is an N-type MOS transistor. A gate of the first transistor M1, a gate of the second transistor M2 and a gate of the third transistor M3 are electrically connected to the first output terminal of the driver branch 110, a source of the first transistor M1 is electrically connected to the output terminal of the pull-up current source IPU, a source of the second transistor M2 is electrically connected to the output terminal of the first current source IB1, a source of the third transistor M3 is electrically connected to the predetermined voltage $V_{CP}$, a drain of the first transistor M1 is electrically connected to the control terminal of the to-be-driven switch Q and a source of the fourth transistor M4, a drain of the second transistor M2 is electrically connected to the first terminal of the first clamp assembly and a gate of the fourth transistor M4, and a drain of the third transistor M3 is electrically connected to a drain of the fourth transistor M4.

Upon receiving a turn-on drive signal Driver_on, the driver branch 110 may generate a turn-on control signal Driver_on_z1, and output the turn-on control signal Driver_on_z1 via the first output terminal thereof. Under the effect of the turn-on control signal Driver_on_z1, the first transistor M1, the second transistor M2, and the third transistor M3 are all in the turned-on state. The pull-up current source IPU starts pulling up a gate voltage $V_G$ of the to-be-driven switch Q, and meanwhile the first current source IB1 starts charging the second capacitor C2 and the first capacitor C1 is discharged. A gate voltage $V_{G4}$ of the fourth transistor M4 is pulled up until a gate-source voltage $V_{GS4}$ of the fourth transistor M4 is greater than a threshold voltage $V_{th4}$ of the fourth transistor M4, and the fourth transistor M4 is turned on.

Afterwards, a voltage between a gate of the to-be-driven switch Q and the gate of the fourth transistor M4 may be clamped by the first clamp assembly to a first clamp voltage $V_{z1}$, the gate voltage $V_G$ of the to-be-driven switch Q constantly follows the gate voltage $V_{G4}$ of the fourth transistor M4, and the first current source IB1 charges the first capacitor C1 until the gate voltage $V_{G4}$ of the fourth transistor M4 rises to approach the predetermined voltage $V_{CP}$. During this time period, the gate voltage $V_G$ of the to-be-driven switch Q follows the gate voltage $V_{G4}$ of the fourth transistor M4, and a turn-on pull-up current is mainly from the fourth transistor M4.

Afterwards, in a case where the gate voltage $V_G$ of the to-be-driven switch Q rises to $V_{CP}$-$V_{th4}$, the fourth transistor M4 is turned off. Then, the turn-on pull-up current is mainly from the pull-up current source IPU, and the gate voltage $V_G$ of the to-be-driven switch Q is continuously pulled up until the gate voltage $V_G$ of the to-be-driven switch Q reaches the predetermined voltage $V_{CP}$.

Figure 7:
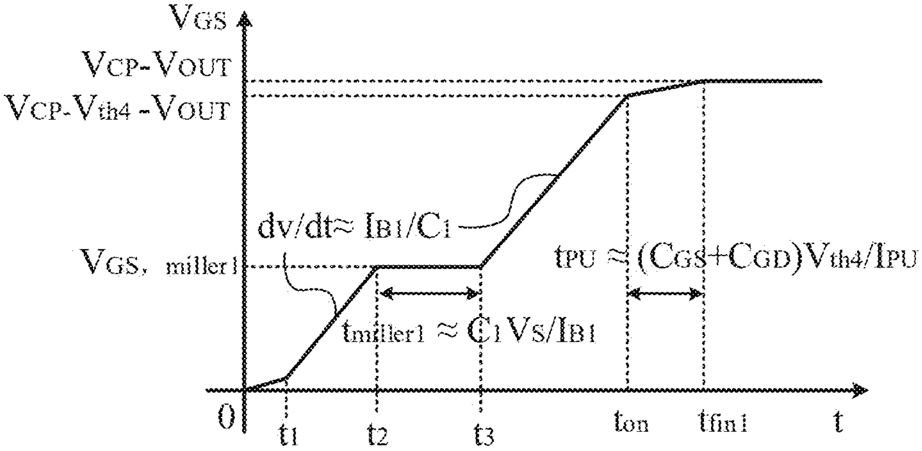
FIG. 7 is a schematic structural diagram of a switch driver circuit according to some embodiments of the present disclosure.

For example, FIG. 7 is a schematic diagram of changes of a gate-source voltage during turning on of a to-be-driven switch according to some embodiments of the present disclosure. Under the same power supply voltage VS, with respect to to-be-driven switches Q of different sizes, from a starting time 0 when the to-be-driven switch Q is turned on to a time $t_1$ when the fourth transistor M4 is turned on, that is, within a time period 0-$t_1$, the pull-up current source IPU provides a pull-up current. $t_1 \approx (C_1+C_2)V_{th4}/I_{B1}$, wherein $C_1$ represents a capacitance value of the first capacitor $C_1$, $C_2$ represents a capacitance value of the second capacitor C2, and Isi represents an output current of the first current source IB1. Since the time $t_1$ is short and the pull-up current provided by the pull-up current source IPU is relatively small, within the time period 0-$t_1$, the gate-source voltage $V_{GS}$ of the to-be-driven switch Q does not change significantly, as illustrated in FIG. 7. Apparently, within the time period 0-$t_1$, the gate-source voltage $V_{GS}$ of the to-be-driven switch Q is only related to the output current Isi of the first current source IB1, but is not related to the process and temperature of the to-be-driven switch Q.

Afterwards, the fourth transistor M4 starts operating, the gate voltage $V_G$ of the to-be-driven switch Q follows the gate voltage $V_{G4}$ of the fourth transistor M4 until at a time $t_2$, the to-be-driven switch Q enters a Miller plateau. Within a time period $t_1$-$t_2$, the gate voltage $V_{G4}$ of the fourth transistor M4 is provided by the output current Isi of the first current source IB1, a rate of change dv/dt of the gate voltage $V_{G4}$ of the fourth transistor M4 over time is approximately equal to $I_{B1}/C_1$, then a rate of change dv/dt of the gate-source voltage $V_{GS}$ of the to-be-driven switch Q over time is approximately equal to $I_{B1}/C_1$, as illustrated in FIG. 7. Apparently, within the time period $t_1$-$t_2$, the gate-source voltage $V_{GS}$ of the to-be-driven switch Q is not related to the process and temperature of the to-be-driven switch Q.

Afterwards, the fourth transistor M4 charges a gate-drain capacitor CGD of the to-be-driven switch Q, and the gate voltage $V_G$ of the to-be-driven switch Q continues to follow the gate voltage $V_{G4}$ of the fourth transistor M4 until at a time $t_3$, a source-drain voltage $V_{DS}$ of the to-be-driven switch Q is less than a saturation region voltage, and the to-be-driven switch Q exits the Miller plateau. As illustrated in FIG. 7, a Miller plateau time $t_{miller1}=t_3-t_2$, which may be estimated as $C_1VS/I_{B1}$. Within the Miller plateau time $t_{miller1}$, the gate-source voltage $V_{GS}$ of the to-be-driven switch Q remains unchanged, that is, $V_{GS,miller1}$ as illustrated in FIG. 7. That is, within a time period $t_2$-$t_3$, the gate-source voltage $V_{GS}$ of the to-be-driven switch Q is not related to the process and temperature of the to-be-driven switch Q.

Afterwards, the gate voltage $V_G$ of the to-be-driven switch Q follows the gate voltage $V_{G4}$ of the fourth transistor M4 and continues to rise. As illustrated in FIG. 7, a rate of change dv/dt of the gate-source voltage $V_{GS}$ of the to-be-driven switch Q over time is approximately equal to $I_{B1}/C_1$, and at a time $t_{on}$, the gate-source voltage $V_{GS}$ of the to-be-driven switch Q rises to $V_{CP}$-$V_{th4}$-$V_{OUT}$. In this case, the fourth transistor M4 is turned off, and the to-be-driven switch Q has been substantially turned on. Apparently, within a time period $t_3$–$t_{on}$, the gate-source voltage $V_{GS}$ of the to-be-driven switch Q is not related to the process and temperature of the to-be-driven switch Q.

Then, the turn-on pull-up current is mainly from the pull-up current source IPU, the pull-up current source IPU continues to pull up the gate-source voltage $V_{GS}$ of the to-be-driven switch Q until at a time $t_{fin1}$, the gate-source voltage $V_{GS}$ of the to-be-driven switch Q reaches $V_{CP}$-$V_{OUT}$, as illustrated in FIG. 7. $t_{fin1}-t_{on}=t_{PU} \approx (C_{GS}+C_{GD})V_{th4}/I_{PU}$, wherein $C_{GS}$ represents a capacitance value of the gate-source capacitor $C_{GS}$ of the to-be-driven switch Q, $C_{GD}$ represents a capacitance value of a gate-drain capacitor CGD of the to-be-driven switch Q, and $I_Pu$ represents an output current of the pull-up current source IPU.

Therefore, in the process of turning on the to-be-driven switch Q, most of the time, the rate of change dv/dt of the gate-source voltage $V_{GS}$ of the to-be-driven switch Q over time is approximately equal to $I_{B1}/C_1$, which is not related to the size and process of the to-be-driven switch Q. Therefore, the to-be-driven switch Q may be turned on within a predetermined turn-on time.

For example, the first clamp assembly may be a Zener diode. For example, as illustrated in FIG. 4 and FIG. 6, the first clamp assembly includes a first Zener diode Dz1. A cathode of the first Zener diode Dz1 is electrically connected to the control terminal of the fourth transistor M4, and an anode of the first Zener diode Dz1 is electrically connected to the control terminal of the to-be-driven switch Q.

In some other embodiments, the first clamp assembly may be a plurality of diodes that are connected in series and forwardly turned on, or may be a device that generates a fixed voltage based on a current flowing through. The type of the first clamp assembly is not specifically limited in the embodiments of the present disclosure.

It should be noted that in the embodiments of the present disclosure, the first clamp assembly is described using one Zener diode as an example, and the number of Zener diodes in the first clamp assembly is not limited. In practical applications, the number of Zener diodes may be determined based on a breakdown voltage of the Zener diodes and a withstand voltage of a gate-source voltage $V_{GS4}$ of the fourth transistor M4.

In some embodiments, still referring to FIG. 4 and FIG. 6, the auxiliary driver branch 120 further includes a first resistor R1. A first terminal of the first resistor R1 is electrically connected to the control terminal of the fourth transistor M4, and a second terminal of the first resistor R1 is electrically connected to the control terminal of the to-be-driven switch Q.

For example, in a case where the to-be-driven switch Q is in the turned-on state, upon receiving a turn-off drive signal Driver_off, the driver branch 110 may generate an auxiliary turn-off control signal Driver_off_z2, and output the auxiliary turn-off control signal Driver_off_z2 via the first output terminal thereof. Under the effect of the auxiliary turn-off control signal Driver_off_z2, the first transistor M1, the second transistor M2 and the third transistor M3 are turned off, and the first clamp assembly transitions to a high-resistance state. In this case, the gate voltage of the fourth transistor M4 is quickly released via the first resistor R1, such that the fourth transistor M4 is quickly turned off, and hence the to-be-driven switch Q is quickly turned off.

In some embodiments, still referring to FIG. 5 and FIG. 6, the turn-off auxiliary driver circuit 122 includes a pull-down current source IPD, a second current source IB2, a third capacitor C3, a fourth capacitor C4, a fifth transistor M5, a sixth transistor M6, a seventh transistor M7, an eighth transistor M8, and a second clamp assembly.

The control terminal of the to-be-driven switch Q is electrically connected to a first terminal of the eighth transistor M8, a first plate of the third capacitor C3, a first terminal of the second clamp assembly and a first terminal of the fifth transistor M5, a second terminal of the second clamp assembly is electrically connected to a first terminal of the sixth transistor M6, a second plate of the third capacitor C3, a first plate of the fourth capacitor C4 and a control terminal of the eighth transistor M8, a second terminal of the eighth transistor M8 is electrically connected to a first terminal of the seventh transistor M7, a second terminal of the fifth transistor M5 is electrically connected to an input terminal of the pull-down current source IPD, a second terminal of the sixth transistor M6 is electrically connected to an input terminal of the second current source IB2, a second terminal of the seventh transistor M7 is electrically connected to an output terminal of the pull-down current source IPD, an output terminal of the second current source IB2, a second plate of the fourth capacitor C4 and a second terminal of the to-be-driven switch Q, and a control terminal of the fifth transistor M5, a control terminal of the sixth transistor M6 and a control terminal of the seventh transistor M7 are both electrically connected to the second output terminal of the driver branch 110.

Specifically, as illustrated in FIG. 5 and FIG. 6, the fifth transistor M5, the sixth transistor M6 and the seventh transistor M7 are all N-type MOS transistors, and the eighth transistor M8 is a P-type MOS transistor. A gate of the fifth transistor M5, a gate of the sixth transistor M6 and a gate of the seventh transistor M7 are electrically connected to the second output terminal of the driver branch 110, a source of the fifth transistor M5 is electrically connected to the input terminal of the pull-down current source IPD, a source of the sixth transistor M6 is electrically connected to the input terminal of the second current source IB2, a drain of the seventh transistor M7 is electrically connected to a drain of the eighth transistor M8, a source of the seventh transistor M7 is electrically connected to the second terminal of the to-be-driven switch Q, a source of the eighth transistor M8 is electrically connected to the control terminal of the to-be-driven switch Q, a drain of the fifth transistor M5 is electrically connected to the control terminal of the to-be-driven switch Q, and a drain of the sixth transistor M6 is electrically connected to a control terminal of the eight transistor M8.

Upon receiving a turn-off drive signal Driver_off, the driver branch 110 may generate a turn-off control signal Driver_off_z1, and output the turn-off control signal Driver_on_z1 via the second output terminal thereof. Under the effect of the turn-off control signal Driver_off_z1, the fifth transistor M5, the sixth transistor M6, and the seventh transistor M7 are in the turned-on state. The pull-down current source IPD starts pulling down the gate voltage $V_G$ of the to-be-driven switch Q, and meanwhile the second current source 132 starts charging the third capacitor C3 and the fourth capacitor C4 is discharged. Agate voltage $V_{GS}$ of the eighth transistor M8 is pulled down, until a gate-source voltage $V_{GS}$s of the eighth transistor M8 is less than a threshold voltage $V_{th8}$ of the eighth transistor M8, the eight transistor M8 is turned on.

Afterwards, a voltage between the gate of the to-be-driven switch Q and the gate of the eighth transistor M8 may be clamped by the second clamp assembly to a second clamp voltage $V_{z2}$, the gate voltage $V_G$ of the to-be-driven switch Q constantly follows the gate voltage $V_{GS}$ of the eighth transistor M8, and the second current source IB2 continues to charge the fourth capacitor C4 until the gate voltage $V_{GS}$ of the eighth transistor M8 falls to approach the voltage $V_{OUT}$ of the load. During this time period, the gate voltage $V_G$ of the to-be-driven switch Q follows the gate voltage $V_{GS}$ of the eighth transistor M8, and a turn-off pull-down current is mainly from the eighth transistor M8.

Then, in a case where the gate voltage $V_G$ of the to-be-driven switch Q falls to $V_{OUT}$-$V_{th8}$, the eighth transistor M8 is turned off, and the turn-off pull-down current is mainly from the pull-down current source IPD. The gate voltage $V_G$ of the to-be-driven switch Q is continuously pulled down until the gate voltage $V_G$ reaches the voltage $V_{OUT}$ of the load.

Figure 8:
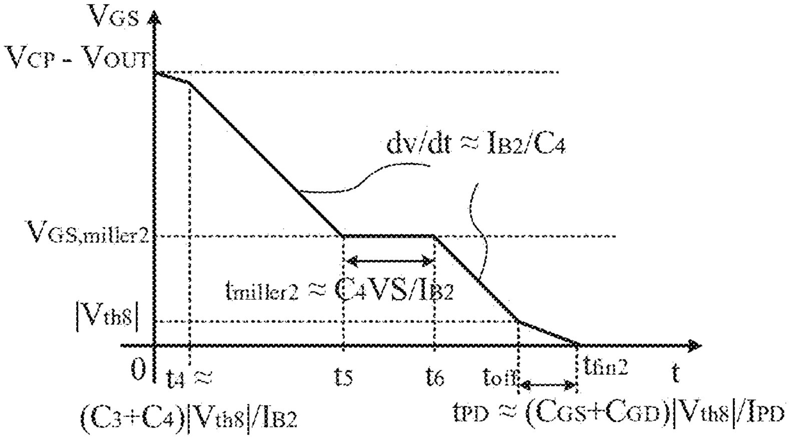
FIG. 8 is a schematic structural diagram of a switch driver circuit according to some embodiments of the present disclosure.

For example, FIG. 8 is a schematic diagram of changes of a gate-source voltage during turning off of a to-be-driven switch according to some embodiments of the present disclosure. Under the same power supply voltage VS, with respect to to-be-driven switches Q of different sizes, from a starting time 0 when the to-be-driven switch Q is turned off to a time $t_4$ when the eighth transistor M8 is turned on, that is, within a time period 0-$t_4$, the pull-down current source IPD provides a pull-down current. $t_4 \approx (C_3+C_4)|V_{th8}|/I_{B2}$, wherein $C_3$ represents a capacitance value of the third capacitor C3, $C_4$ represents a capacitance value of the fourth capacitor C4, and $I_{B2}$ represents an output current of the second current source $I_{B2}$. Since the time $t_4$ is short and the pull-up current provided by the pull-up current source IPU is relatively small, within the time period 0-$t_4$, the gate-source voltage $V_{GS}$ of the to-be-driven switch Q does not change significantly, as illustrated in FIG. 8. Apparently, within the time period 0-$t_4$, the gate-source voltage $V_{GS}$ of the to-be-driven switch Q is only related to an output current $I_{B2}$ of the second current source $I_{B2}$, but is not related to the process and temperature of the to-be-driven switch Q.

Afterwards, the eighth transistor M8 starts operating, the gate voltage $V_G$ of the to-be-driven switch Q follows the gate voltage $V_{GS}$ of the eighth transistor M8, until at a time $t_5$, the to-be-driven switch Q enters a Miller plateau. Within a time period $t_4$-$t_5$, the gate voltage $V_{GS}$ of the eighth transistor M8 is provided by the output current $I_{B2}$ of the second current source $I_{B2}$, a rate of change dv/dt of the gate voltage $V_{G4}$ of the eighth transistor M8 over time is approximately equal to IB2/$C_4$, then a rate of change dv/dt of the gate-source voltage $V_{GS}$ of the to-be-driven switch Q over time is approximately equal to $I_{B2}/C_4$, as illustrated in FIG. 8. Apparently, within the time period $t_4$-$t_5$, the gate-source voltage $V_{GS}$ of the to-be-driven switch Q is not related to the process and temperature of the to-be-driven switch Q.

Afterwards, the eighth transistor M8 starts charging the gate-drain capacitor CGD of the to-be-driven switch Q, the gate voltage $V_G$ of the to-be-driven switch Q still follows the gate voltage $V_{G8}$ of the eighth transistor M8, until at a time $t_6$, the to-be-driven switch Q exits the Miller plateau. As illustrated in FIG. 8, within a Miller plateau time $t_{miller2}=t_6-t_5$, $C_4VS/I_{B2}$ may be estimated, and within the Miller plateau time $t_{miller2}$, the gate-source voltage $V_{GS}$ of the to-be-driven switch Q remains unchanged, that is, $V_{GS,miller2}$ as illustrated in FIG. 8. That is, within a time period $t_5$-$t_6$, the gate-source voltage $V_{GS}$ of the to-be-driven switch Q is not related to the process and temperature of the to-be-driven switch Q.

Afterwards, the gate voltage $V_G$ of the to-be-driven switch Q follows the gate voltage $V_{G8}$ of the eighth transistor M8 and continues to rise. As illustrated in FIG. 8, a rate of change dv/dt of the gate-source voltage $V_{GS}$ of the to-be-driven switch Q over time is approximately equal to $I_{B2}/C_4$, until at a time $t_{off}$, the gate-source voltage $V_{GS}$ of the to-be-driven switch Q falls to $|V_{th8}|$. In this case, the eighth transistor M8 is turned off, and the to-be-driven switch Q has been substantially turned off. Apparently, within a time period $t_6-t_{off}$, the gate-source voltage $V_{GS}$ of the to-be-driven switch Q is not related to the process and temperature of the to-be-driven switch Q.

Then, the turn-off pull-down current is mainly from the pull-down current source IPD, the pull-down current source IPD continues to pull down the gate-source voltage $V_{GS}$ of the to-be-driven switch Q, until at a time $t_{fin2}$, the gate-source voltage $V_{GS}$ of the to-be-driven switch Q reaches 0, as illustrated in FIG. 8 $t_{fin2}-t_{off}=t_{PD}\approx(C_{GS}+C_{GD})|V_{th8}|/I_{PD}$, wherein $I_{PD}$ represents an output current of the pull-down current source IPD.

Therefore, in the process of turning off the to-be-driven switch Q, most of the time, the rate of change dv/dt of the gate-source voltage $V_{GS}$ of the to-be-driven switch Q over time is approximately equal to $I_{B2}/C_4$, which is not related to the size and process of the to-be-driven switch Q. Therefore, the to-be-driven switch Q may be turned off within a predetermined turn-off time.

For example, the second clamp assembly may be a Zener diode. For example, as illustrated in FIG. 5 and FIG. 6, the second clamp assembly includes a second Zener diode Dz2. An anode of the second Zener diode Dz2 is electrically connected to the control terminal of the eighth transistor M8, and a cathode of the second Zener diode Dz2 is electrically connected to the control terminal of the to-be-driven switch Q.

In some other embodiments, the second clamp assembly may be a plurality of diodes that are connected in series and forwardly turned on, or may be a device that generates a fixed voltage based on a current flowing through. The type of the second clamp assembly is not specifically limited in the embodiments of the present disclosure.

It should be noted that in the embodiments of the present disclosure, the second clamp assembly is described using one Zener diode as an example, and the number of Zener diodes in the second clamp assembly is not limited. In practical applications, the number of Zener diodes may be determined based on a breakdown voltage of the Zener diodes and a withstand voltage of a gate-source voltage $V_{GS8}$ of the eighth transistor M8.

In some embodiments, still referring to FIG. 5 and FIG. 6, the auxiliary driver branch 120 further includes a second resistor R2, wherein a first terminal of the second resistor R2 is electrically connected to the control terminal of the to-be-driven switch Q, and a second terminal of the second resistor R2 is electrically connected to the control terminal of the eighth transistor M8.

For example, in a case where the to-be-driven switch Q is in the turned-off state, upon receiving a turn-on drive signal Driver_on, the driver branch 110 may generate an auxiliary turn-on control signal Driver_on_z2, and output the auxiliary turn-on control signal Driver_on_z2 via the second output terminal thereof. Under the effect of the auxiliary turn-on drive signal Driver_on_z2, the fifth transistor M5, the sixth transistor M6 and the seventh transistor M7 are turned off, and the second clamp assembly transitions to a high-resistance state. In this case, the gate voltage of the eighth transistor M8 is quickly released via the second resistor R2, such that the eighth transistor M8 is quickly turned on, and hence the to-be-driven switch Q is quickly turned on.

In some embodiments, still referring to FIG. 4, the auxiliary driver branch 120 further includes a pull-down circuit 123. A first input terminal of the pull-down circuit 123 is electrically connected to the control terminal of the to-be-driven switch Q, a second input terminal of the pull-down circuit 123 is electrically connected to the control terminal of the fourth transistor M4, an output terminal of the pull-down circuit 123 is electrically connected to the second terminal of the to-be-driven switch Q, and a control terminal of the pull-down circuit 123 is electrically connected to the second output terminal of the driver branch 110.

For example, as illustrated in FIG. 4, the pull-down circuit 123 includes a ninth transistor M9 and a tenth transistor M10. A first terminal of the ninth transistor M9 is electrically connected to the control terminal of the to-be-driven switch Q, a first terminal of the tenth transistor M10 is electrically connected to the control terminal of the fourth transistor M4, a second terminal of the ninth transistor M9 and a second terminal of the tenth transistor M10 are both electrically connected to the second terminal of the to-be-driven switch Q, and a control terminal of the tenth transistor M10 and a control terminal of the ninth transistor M9 are both electrically connected to the second output terminal of the driver branch 110.

Specifically, as illustrated in FIG. 4, the ninth transistor M9 and the tenth transistor M10 are both N-type MOS transistors. A gate of the ninth transistor M9 and a gate of the tenth transistor M10 are both electrically connected to the second output terminal of the driver branch 110, a source of the ninth transistor M9 and a source of the tenth transistor M10 are both electrically connected to the second terminal of the to-be-driven switch Q, a drain of the ninth transistor M9 is electrically connected to the control terminal of the to-be-driven switch Q, and a drain of the tenth transistor M10 is electrically connected to the control terminal of the fourth transistor M4.

The driver branch 110 may generate a turn-off control signal Driver_off_z1 based on the received turn-off drive signal Driver_off, and transmit the turn-off control signal Driver_off_z1 to the gate of the ninth transistor M9 and the gate of the tenth transistor M10 via the second output terminal thereof. Under the effect of the turn-off control signal Driver_off_z1, the ninth transistor M9 and the tenth transistor M10 are electrically connected, i.e., the control terminal the fourth transistor M4 is electrically connected to the second terminal of the to-be-driven switch Q, and the control terminal of the to-be-driven switch Q is electrically connected to the second terminal of the to-be-driven switch Q.

By electrical connection between the control terminal of the fourth transistor M4 and the second terminal of the to-be-driven switch Q, a voltage at the control terminal of the fourth transistor M4 may be pulled down, such that the fourth transistor M4 is turned off, and hence the control terminal of the to-be-driven switch Q is electrically disconnected from the predetermined voltage $V_{CP}$. Meanwhile, by electrical connection between the control terminal of the to-be-driven switch Q and the second terminal of the to-be-driven switch Q, the voltage at the control terminal of the to-be-driven switch Q is quickly pulled down, such that the to-be-driven switch Q is quickly turned off.

As such, the pull-down circuit 123 may, based on the turn-off control signal Driver_off_z1, electrically connect the control terminal of the to-be-driven switch Q to the second terminal of the to-be-driven switch Q, and meanwhile electrically connect the control terminal of the fourth transistor M4 to the second terminal of the to-be-driven switch Q.

In the embodiments of the present disclosure, the auxiliary driver branch further includes a pull-down circuit. The first input terminal of the pull-down circuit is electrically connected to the control terminal of the to-be-driven switch, the second input terminal of the pull-down circuit is electrically connected to the control terminal of the fourth transistor, the output terminal of the pull-down circuit is electrically connected to the second terminal of the to-be-driven switch, and the control terminal of the pull-down circuit is electrically connected to the second output terminal of the driver branch. By the pull-down circuit, the control terminal of the to-be-driven switch may be electrically connected to the second terminal of the to-be-driven switch based on the turn-off control signal, and meanwhile the control terminal of the fourth transistor may be electrically connected to the second terminal of the to-be-driven switch, such that the voltage at the control terminal of the to-be-driven switch is quickly pulled down, and hence the to-be-driven switch is quickly turned off.

Figure 9:
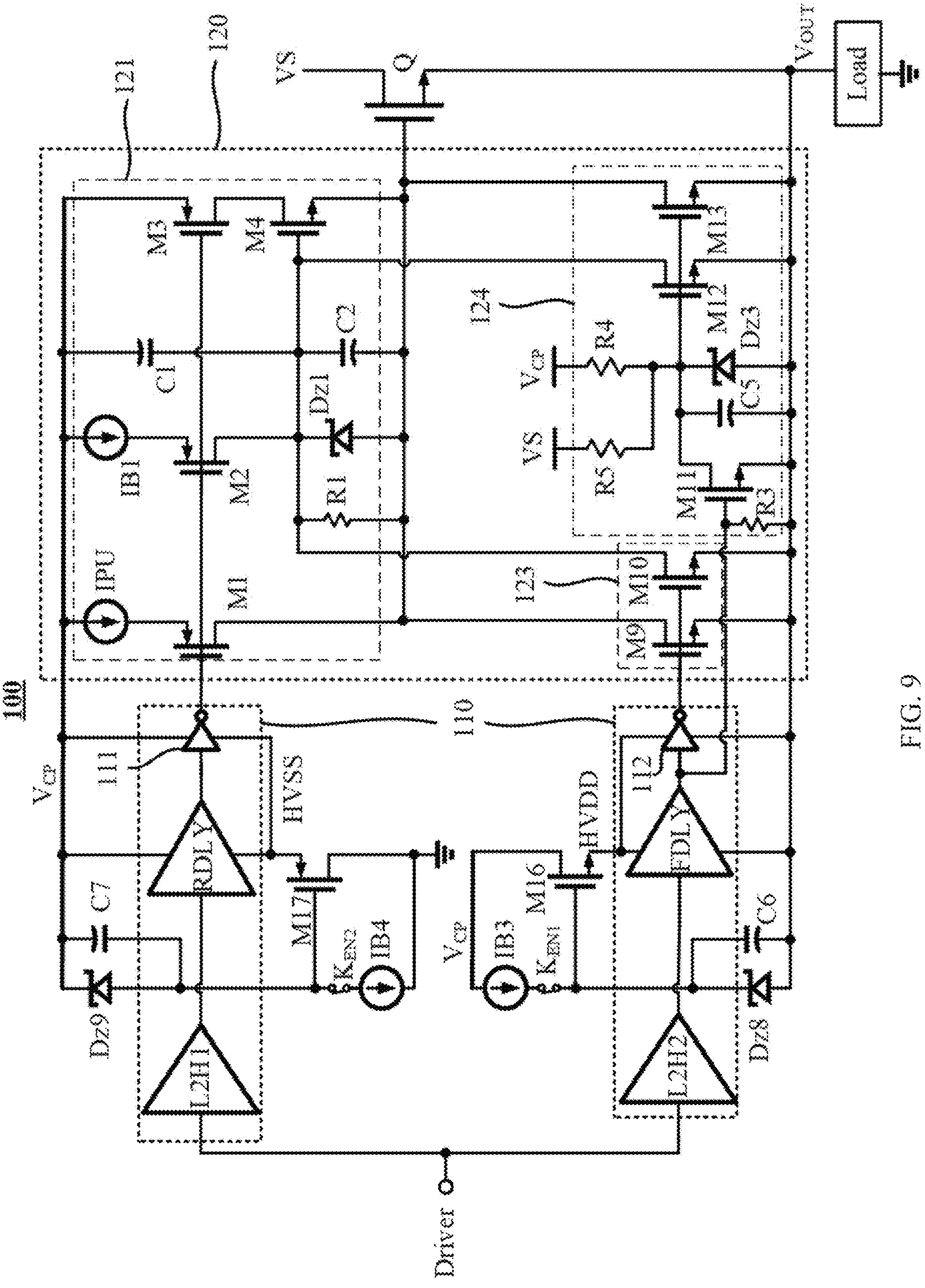
FIG. 9 is a schematic structural diagram of a switch driver circuit according to some embodiments of the present disclosure.
Figure 10:
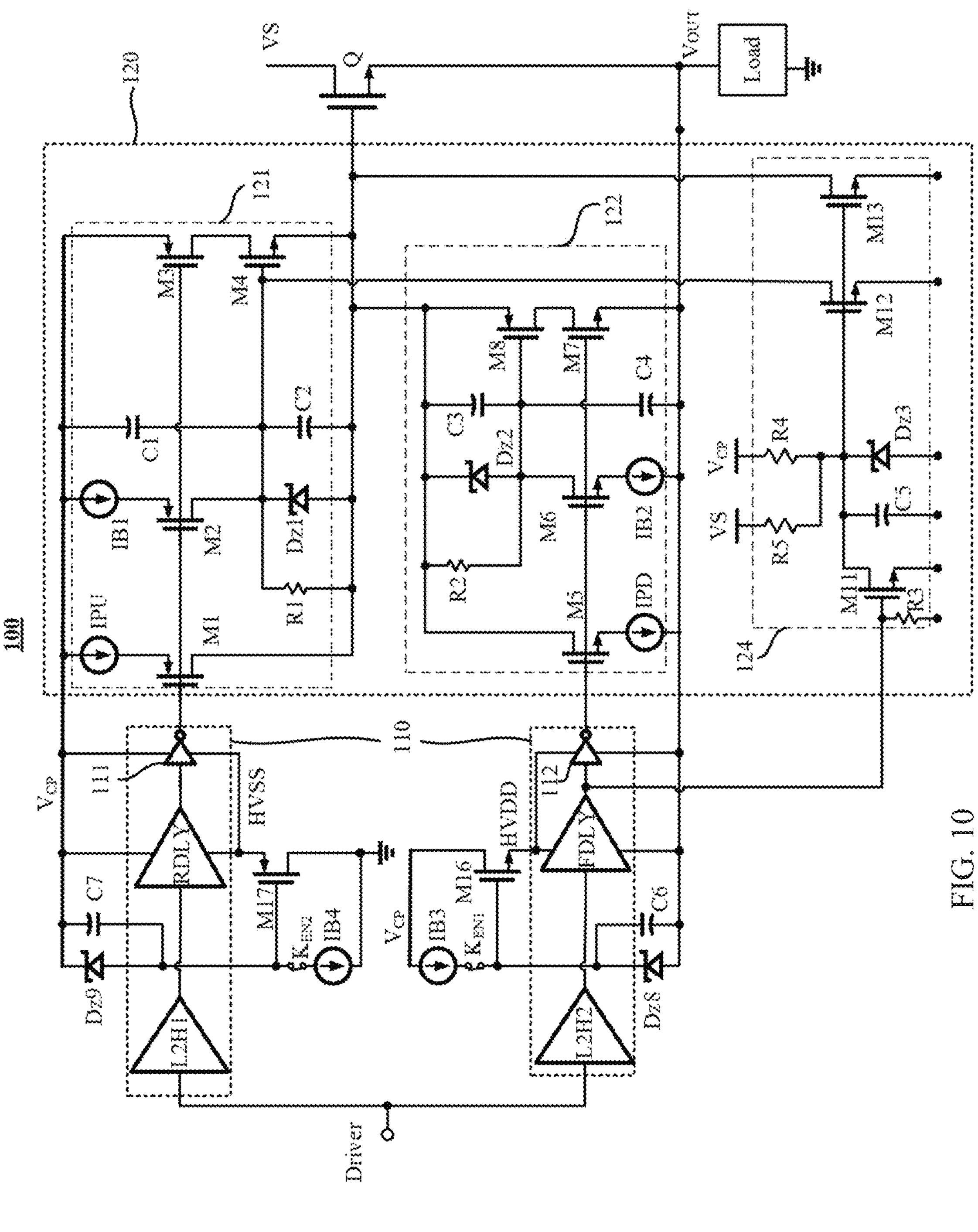
FIG. 10 is a schematic structural diagram of a switch driver circuit according to some embodiments of the present disclosure.

In some other embodiments, FIG. 9 is a schematic structural diagram of a switch driver circuit according to some embodiments of the present disclosure, and FIG. 10 is a schematic structural diagram of a switch driver circuit according to some embodiments of the present disclosure. FIG. 9 is based on the embodiments as illustrated in FIG. 4, and FIG. 10 is based on the embodiments as illustrated in FIG. 6. As illustrated in FIG. 9 and FIG. 10, the auxiliary driver circuit 120 further includes a protection circuit 124.

A first input terminal of the protection circuit 124 is electrically connected to the predetermined voltage $V_{CP}$, a second input terminal of the protection circuit 124 is electrically connected to the power supply voltage VS, a third input terminal of the protection circuit 124 is electrically connected to the control terminal of the to-be-driven switch Q, a fourth input terminal of the protection circuit 124 is electrically connected to the control terminal of the fourth transistor M4, a control terminal of the protection circuit 124 is electrically connected to a third output terminal of the driver branch 110, and an output terminal of the protection circuit 124 is electrically connected to the second terminal of the to-be-driven switch Q.

For example, as illustrated in FIG. 9 and FIG. 10, the protection circuit 124 includes a third resistor R3, a fourth resistor R4, a fifth resistor R5, an eleventh transistor M11, a twelfth transistor M12, a thirteenth transistor M13, a fifth capacitor C5, and a third clamp assembly.

A control terminal of the eleventh transistor M11 is electrically connected to the third output terminal of the driver branch 110 and a first terminal of the third resistor R3, a first terminal of the eleventh transistor M11 is electrically connected to a first plate of the fifth capacitor C5, a first terminal of the third clamp assembly, a first terminal of the fourth resistor R4, a first terminal of the fifth resistor R5, a control terminal of the twelfth transistor M12 and a control terminal of the thirteenth transistor M13, a first terminal of the twelfth transistor M12 is electrically connected to a control terminal of the fourth transistor M4, a first terminal of the thirteenth transistor M13 is electrically connected to the control terminal of the to-be-driven switch Q, a second terminal of the fourth resistor R4 is electrically connected to the predetermined voltage $V_{CP}$, and a second terminal of the fifth resistor R5 is electrically connected to the power supply voltage VS. A second terminal of the third resistor R3 is electrically connected to a second terminal of the eleventh transistor M11, a second plate of the fifth capacitor C5, a second terminal of the third clamp assembly, a second terminal of the twelfth transistor M12, a second terminal of the thirteenth transistor M13 and the second terminal of the to-be-driven switch Q.

Specifically, as illustrated in FIG. 9 and FIG. 10, the eleventh transistor M11, the twelfth transistor M12, and the thirteenth transistor M13 are all N-type MOS transistors. A gate of the eleventh transistor M11 is electrically connected to the third output terminal of the driver branch 110, wherein the third output terminal of the driver branch 110 is an output terminal of the falling edge delayer FDLY A source of the eleventh transistor M11, a source of the twelfth transistor M12 and a source of the thirteenth transistor M13 are electrically connected to the second terminal of the to-be-driven switch Q, a drain of the eleventh transistor M11, a gate of the twelfth transistor M12 and a gate of the thirteenth transistor M13 are electrically connected, a drain of the twelfth transistor M12 is electrically connected to the control terminal of the fourth transistor M4, and a drain of the thirteenth transistor M13 is electrically connected to the control terminal of the to-be-driven switch Q.

While generating the turn-off control signal Driver_off_z1 based on the turn-off drive signal Driver_off, the driver branch 110 may also generate a protection control signal Driver_off_d, and output the protection control signal Driver_off_d to the gate of the eleventh transistor M11 via the third output terminal thereof. Under the effect of the protection control signal Driver_off_d, the eleventh transistor M11 is turned off. In a case where the power supply voltage VS and/or the predetermined voltage $V_{CP}$ jumps, the current provided by the predetermined voltage $V_{CP}$ or the power supply voltage VS still flows to earth through the third clamp assembly, and the third clamp assembly may clamp a gate-source voltage $V_{GS12}$ of the twelfth transistor M12 and a gate-source voltage $V_{GS13}$ of the thirteenth transistor M13 to a third clamp voltage $V_{z3}$.

Under the effect of the third clamp voltage $V_{z3}$, the twelfth transistor M12 and the thirteenth transistor M13 are in a turned-on state, and the voltage at the control terminal of the fourth transistor M4 and the voltage at the control terminal voltage of the to-be-driven switch Q are pulled down, such that the to-be-driven switch Q is constantly in a turned-off state. As such, the protection circuit 124 is capable of controlling the to-be-driven switch Q to be constantly in the turned-off state in response to a jump of the power supply voltage VS and/or the predetermined voltage $V_{CP}$.

For example, the third clamp assembly may be a Zener diode. For example, as illustrated in FIG. 9 and FIG. 10, the third clamp assembly includes a third Zener diode Dz3. A cathode of the third Zener diode Dz3 is electrically connected to the control terminal of the twelfth transistor M12, and an anode of the third Zener diode Dz3 is electrically connected to the second terminal of the to-be-driven switch Q.

In some other embodiments, the third clamp assembly may be a plurality of diodes that are connected in series and forwardly turned on, or may be a device that generates a fixed voltage based on a current flowing through. The type of the third clamp assembly is not specifically limited in the embodiments of the present disclosure.

It should be noted that in the embodiments of the present disclosure, the third clamp assembly is described using one Zener diode as an example, and the number of Zener diodes in the third clamp assembly is not limited. In practical applications, the number of Zener diodes may be determined based on a breakdown voltage of the Zener diodes and a withstand voltage of a gate-source voltage $V_{GS12}$ of the twelfth transistor M12.

In the embodiments of the present disclosure, the auxiliary driver branch further includes a protection circuit; wherein a first input terminal of the protection circuit is electrically connected to the predetermined voltage, a second input terminal of the protection circuit is electrically connected to the power supply voltage, a third input terminal of the protection circuit is electrically connected to the control terminal of the to-be-driven switch, a fourth input terminal of the protection circuit is electrically connected to the control terminal of the fourth transistor, a control terminal of the protection circuit is electrically connected to a third output terminal of the driver branch, and an output terminal of the protection circuit is electrically connected to the second terminal of the to-be-driven switch. By the protection circuit, a pull-down current is constantly provided in a case where the power supply voltage and or the predetermined voltage jumps, and the voltage at the control terminal of the fourth transistor and the voltage at the control terminal of the to-be-driven switch are pulled down, such that the to-be-driven switch is constantly in the turned-off state, and hence mis-turn on of the to-be-driven switch is prevented.

Figure 11:
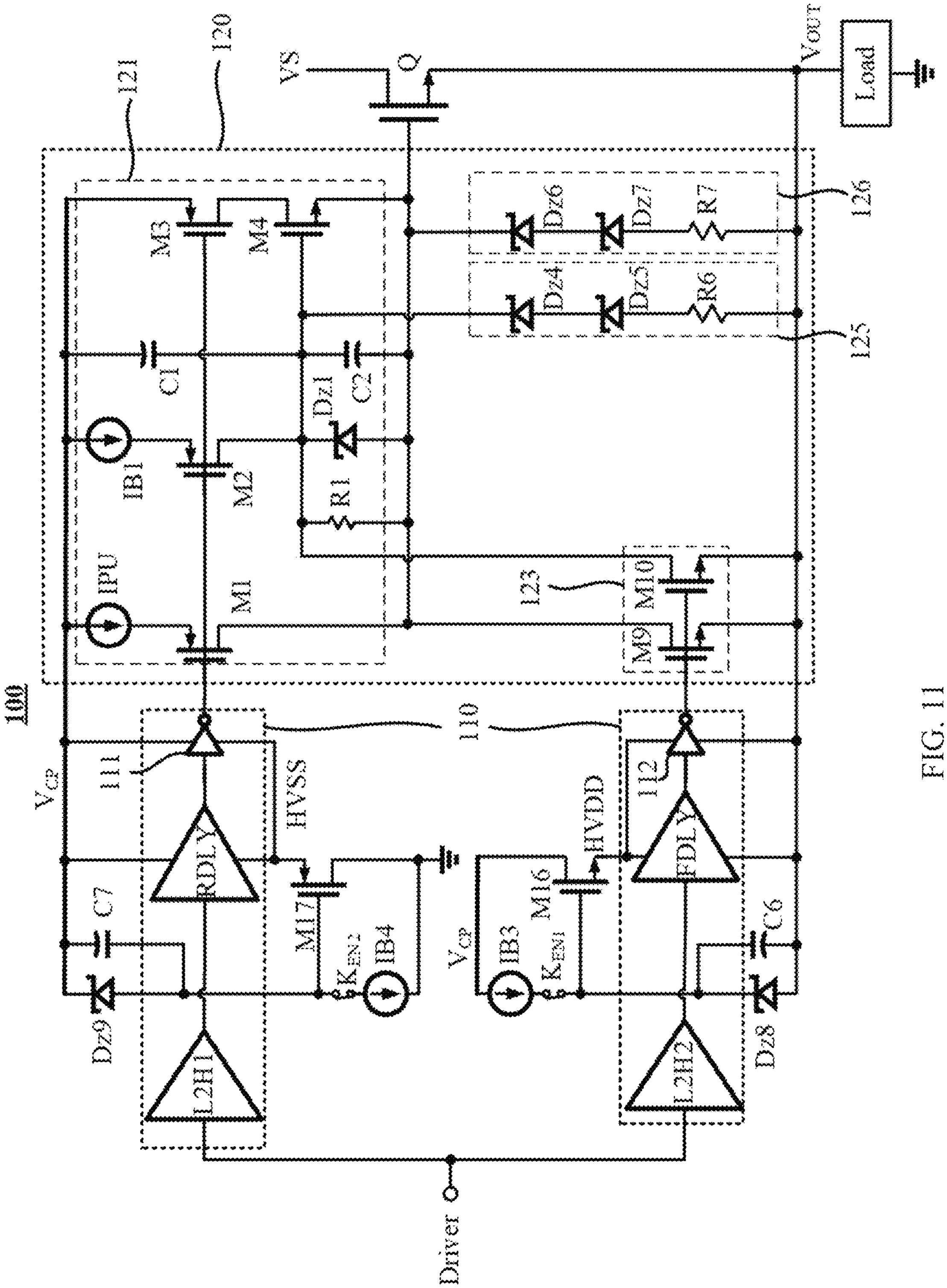
FIG. 11 is a schematic structural diagram of a switch driver circuit according to some embodiments of the present disclosure.

In some other embodiments, FIG. 11 is a schematic structural diagram of a switch driver circuit according to some embodiments of the present disclosure. As illustrated in FIG. 11, based on the embodiments illustrated in FIG. 4, the auxiliary driver circuit 120 further includes a first clamp circuit 125 and a second clamp circuit 126. An input terminal of the first clamp circuit 125 is electrically connected to the control terminal of the fourth transistor M4, an input terminal of the second clamp circuit 126 is electrically connected to the control terminal of the to-be-driven switch Q, and an output terminal of the first clamp circuit 125 and an output terminal of the second clamp circuit 126 are both electrically connected to the second terminal of the to-be-driven switch Q.

For example, in a case where the load is short-circuited or the load is a large capacitive load, the voltage $V_{OUT}$ of the load remains to be a low voltage for a long time, and the first current $I_{B1}$ output by the first current source $I_{B1}$ flows through the first clamp circuit 125. Since the input terminal of the first clamp circuit 125 is electrically connected to the control terminal of the fourth transistor M4, and the output terminal of the first clamp circuit 125 is electrically connected to the second terminal of the to-be-driven switch Q, the first clamp circuit 125 may clamp a voltage between the control terminal of the fourth transistor M4 and the second terminal of the to-be-driven switch Q to a fourth clamp voltage $V_{z4}$.

In this case, an output current $I_{PU}$ of the pull-up current source IPU flows through the second clamp circuit 126. Since the input terminal of the second clamp circuit 126 is electrically connected to the control terminal of the to-be-driven switch Q, and the output terminal of the second clamp circuit 126 is electrically connected to the second terminal of the to-be-driven switch Q, the second clamp circuit 126 may clamp a voltage between the control terminal of the to-be-driven switch Q and the second terminal of the to-be-driven switch Q to a fifth clamp voltage $V_{z5}$.

As such, the first clamp circuit 125 is capable of clamping the voltage between the control terminal of the fourth transistor M4 and the second terminal of the to-be-driven switch Q in a case where the voltage $V_{OUT}$ of the load is less than a predetermined voltage Vpre. The second clamp circuit 126 is capable of clamping the voltage between the control terminal of the to-be-driven switch Q and the second terminal of the to-be-driven switch Q in a case where the voltage $V_{OUT}$ of the load is less than the predetermined voltage Vpre.

Figure 12:
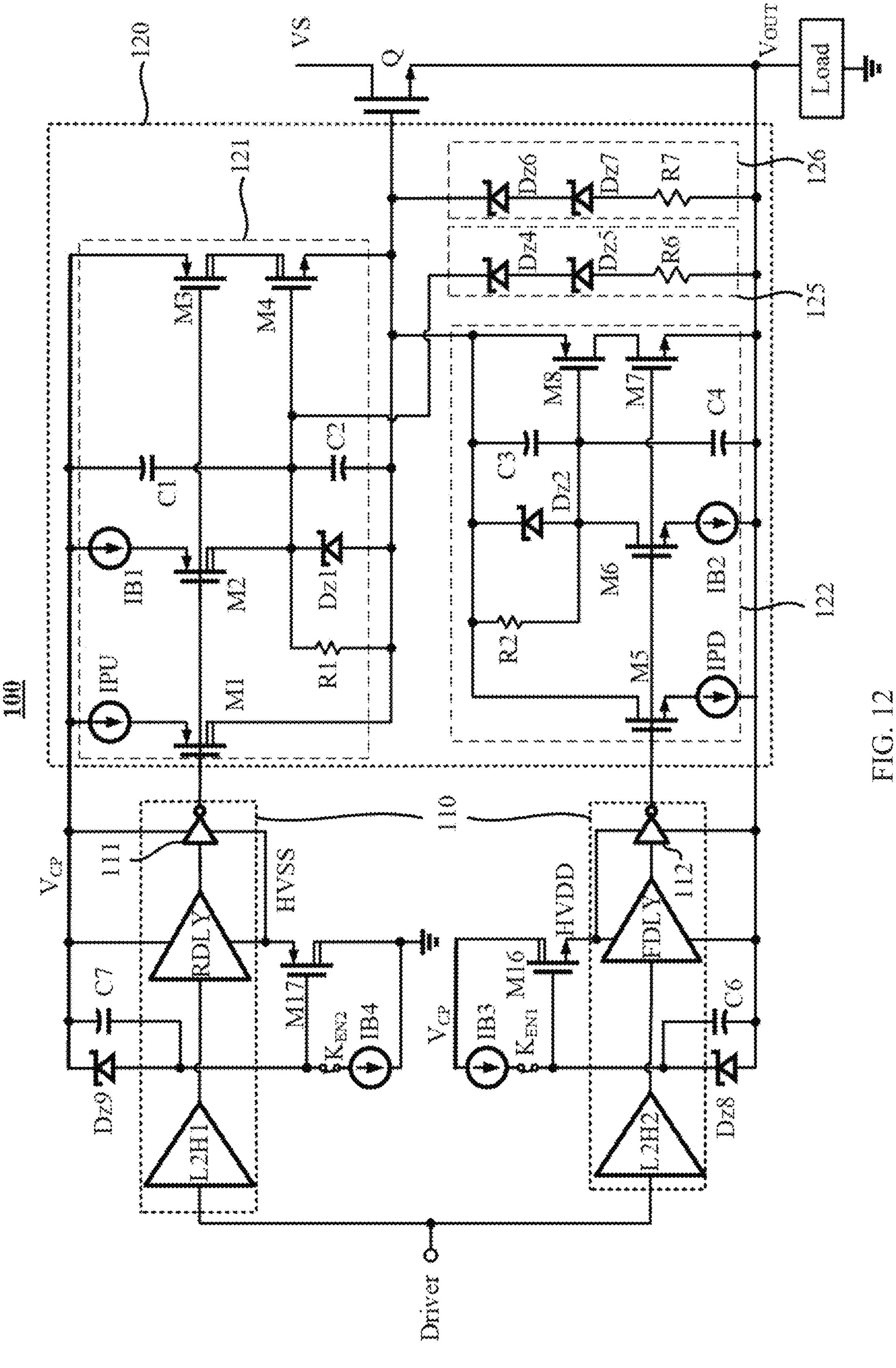
FIG. 12 is a schematic structural diagram of a switch driver circuit according to some embodiments of the present disclosure.
Figure 13:
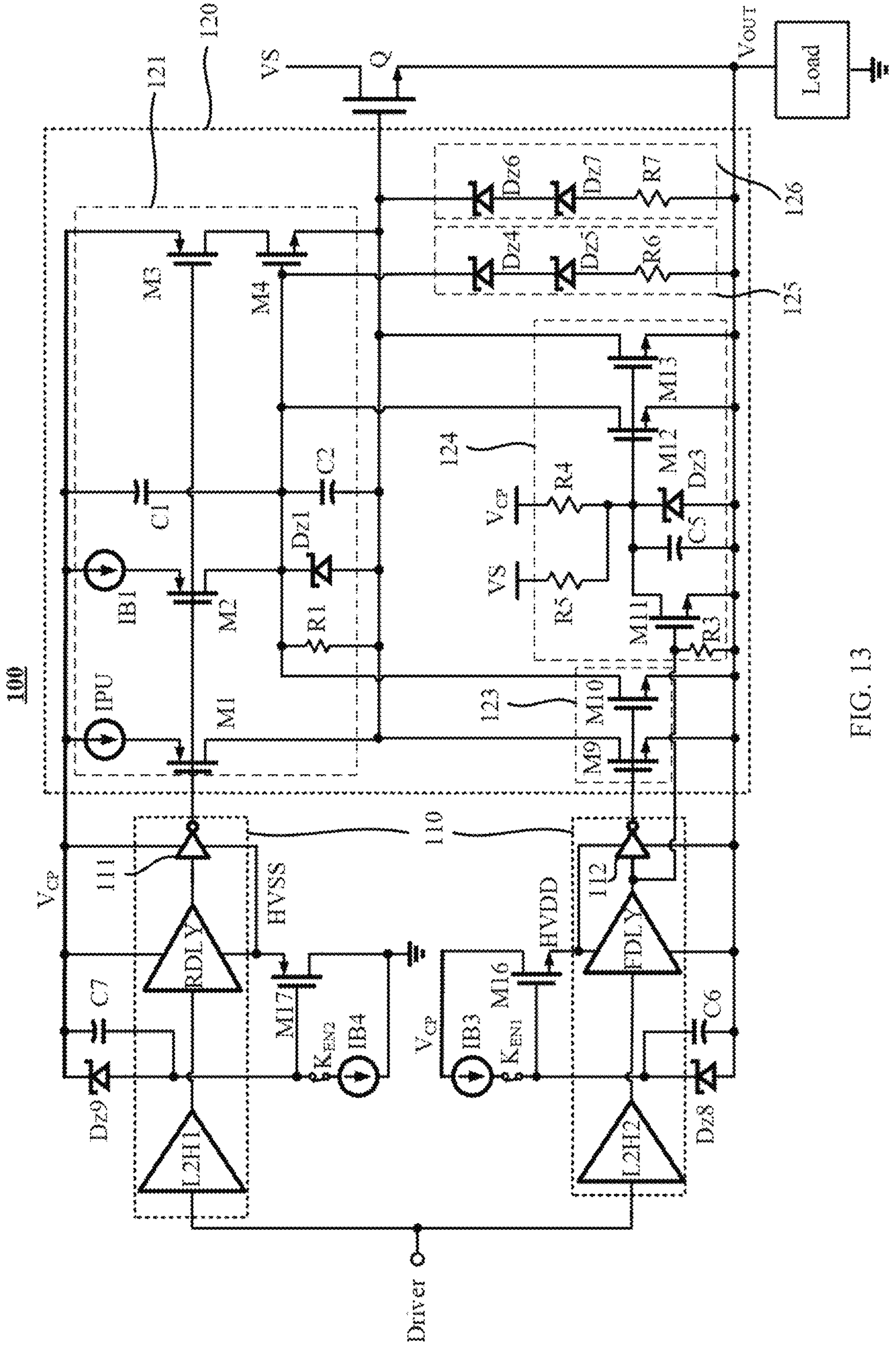
FIG. 13 is a schematic structural diagram of a switch driver circuit according to some embodiments of the present disclosure.
Figure 14:
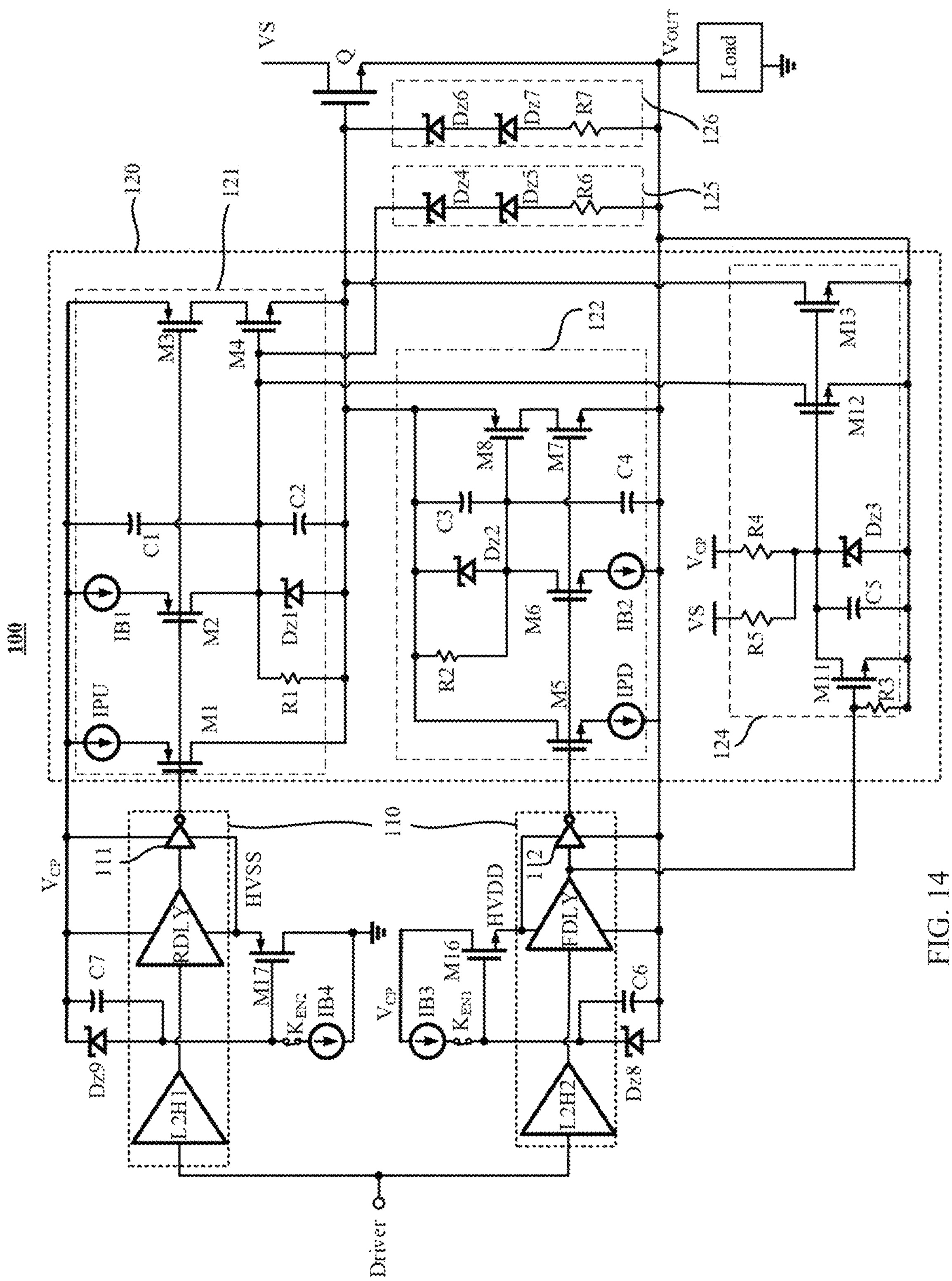
FIG. 14 is a schematic structural diagram of a switch driver circuit according to some embodiments of the present disclosure.

It should be noted that FIG. 11 only illustrates a schematic structural diagram of a switch driver circuit 100 including the first clamp circuit 125 and the second clamp circuit 126. In some other embodiments, the specific structure of the switch driver circuit 100 may be as illustrated in FIG. 12 to FIG. 14.

For example, still referring to FIG. 11 to FIG. 14, the first clamp circuit 125 includes a fourth clamp assembly and a sixth resistor R6. A first terminal of the fourth clamp assembly is electrically connected to the control terminal of the fourth transistor M4, a second terminal of the fourth clamp assembly is electrically connected to a first terminal of the sixth resistor R6, and a second terminal of the sixth resistor R6 is electrically connected to the second terminal of the to-be-driven switch Q.

In some embodiments, as illustrated in FIG. 11 to FIG. 14, the fourth clamp assembly includes a fourth Zener diode Dz4 and a fifth Zener diode Dz5. A cathode of the fourth Zener diode Dz4 is electrically connected to the control terminal of the fourth transistor M4, an anode of the fourth Zener diode Dz4 is electrically connected to a cathode of the fifth Zener diode Dz5, an anode of the fifth Zener diode Dz5 is electrically connected to the first terminal of the sixth resistor R6, and the second terminal of the sixth resistor R6 is electrically connected to the second terminal of the to-be-driven switch Q. In a case where a breakdown voltage of the fourth Zener diode Dz4 and a breakdown voltage of the fifth Zener diode Dz5 are both $V_z$, the fourth clamp voltage $V_{z4}=2V_z+I_{B1}R_6$, wherein $R_6$ represents a resistance of the sixth resistor R6.

It should be noted that in the embodiments of the present disclosure, the fourth clamp assembly is described using two Zener diodes connected in series as an example, and the number of Zener diodes in the fourth clamp assembly is not limited. In practical applications, the number of Zener diodes may be determined based on a breakdown voltage of the Zener diodes, a withstand voltage of a gate-source voltage $V_{GS4}$ of the fourth transistor M4, and a withstand voltage of the gate-source voltage $V_{GS}$ of the to-be-driven switch Q.

It should be noted that in the embodiments of the present disclosure, the fourth clamp assembly is described using Zener diodes as an example. In some other embodiments, the fourth clamp assembly may be a plurality of diodes that are connected in series and forwardly turned on, or may be a device that generates a fixed voltage based on a current flowing through. The type of the fourth clamp assembly is not specifically limited in the embodiments of the present disclosure.

For example, still referring to FIG. 11 to FIG. 14, the second clamp circuit 126 includes a fifth clamp assembly and a seventh resistor R7. A first terminal of the fifth clamp assembly is electrically connected to the control terminal of the to-be-driven switch Q, a second terminal of the fifth clamp assembly is electrically connected to a first terminal of the seventh resistor R7, and a second terminal of the seventh resistor R7 is electrically connected to the second terminal of the to-be-driven switch Q.

In some embodiments, as illustrated in FIG. 11 to FIG. 14, the fifth clamp assembly includes a sixth Zener diode Dz6 and a seventh Zener diode Dz7. A cathode of the sixth Zener diode Dz6 is electrically connected to the control terminal of the to-be-driven switch Q, an anode of the sixth Zener diode Dz6 is electrically connected to a cathode of the seventh Zener diode Dz7, an anode of the seventh Zener diode Dz7 is electrically connected to the first terminal of the seventh resistor R7, and the second terminal of the seventh resistor R7 is electrically connected to the second terminal of the to-be-driven switch Q. In a case where a breakdown voltage of the sixth Zener diode Dz6 and a breakdown voltage of the seventh Zener diode Dz7 are also both $V_z$, the fifth clamp voltage $V_{z5}=2V_z+I_{PU}R_7$, wherein $R_7$ represents a resistance of the seventh resistor R7.

It should be noted that in the embodiments of the present disclosure, the fifth clamp assembly is described using two Zener diodes connected in series as an example, and the number of Zener diodes in the fifth clamp assembly is not limited. In practical applications, the number of Zener diodes may be determined based on a breakdown voltage of the Zener diodes and a withstand voltage of the gate-source voltage $V_{GS}$ of the to-be-driven switch Q.

It should be noted that in the embodiments of the present disclosure, the fifth clamp assembly is described using Zener diodes as an example. In some other embodiments, the fifth clamp assembly may be a plurality of diodes that are connected in series and forwardly turned on, or may be a device that generates a fixed voltage based on a current flowing through. The type of the fifth clamp assembly is not specifically limited in the embodiments of the present disclosure.

Therefore, by configuring the resistance $R_6$ of the sixth resistor R6 and the resistance $R_7$ of the seventh resistor R7, $I_{B1}R_6 \leq I_{PU}R_7$, and hence $V_{G4} \leq V_G$, that is, the gate-source voltage $V_{GS4}$ of the fourth transistor M4 meets $V_{GS4} \leq 0$. In this case, the fourth transistor M4 is turned off, the large current for pull-up is cut off, and the switch driver circuit 100 has no large current. The current Isi flowing through the first clamp circuit 125 and the current $I_{PU}$ flowing through the second clamp circuit 126 are both less than 5 mA. Therefore, the fourth Zener diode Dz4, the fifth Zener diode Dz5, the sixth Zener diode Dz6, and the seventh Zener diode Dz7 do not need to have a large power capacity. In this way, the size and cost of the switch driver circuit 100 may be reduced. In addition, during clamping, the current is small and less heat is generated, and thus power consumption of the switch driver circuit 100 may be lowered.

In some embodiments, still referring to FIG. 5, the auxiliary driver branch 120 includes a pull-up circuit 127. A first output terminal of the pull-up circuit 127 is electrically connected to the control terminal of the to-be-driven switch Q, a second output terminal of the pull-up circuit 127 is electrically connected to the control terminal of the eighth transistor M8, a control terminal of the pull-up circuit 127 is electrically connected to the first output terminal of the driver branch 110, and an input terminal of the pull-up circuit 127 is electrically connected to the predetermined voltage $V_{CP}$.

For example, as illustrated in FIG. 5, the pull-up circuit 127 includes a fourteenth transistor M14 and a fifteenth transistor M15. The predetermined voltage $V_{CP}$ is electrically connected to a first terminal of the fourteenth transistor M14 and a first terminal of the fifteenth transistor M15, a second terminal of the fourteenth transistor M14 is electrically connected to the control terminal of the to-be-driven switch Q, a second terminal of the fifteenth transistor M15 is electrically connected to the control terminal of the eighth transistor M8, and a control terminal of the fourteenth transistor M14 and a control terminal of the fifteenth transistor M15 are both electrically connected to the first output terminal of the driver branch 110.

Specifically, the fourteenth transistor M14 and the fifteenth transistor M15 are both P-type MOS transistors. A source of the fourteenth transistor M14 and a source of the fifteenth transistor M15 are both electrically connected to the predetermined voltage $V_{CP}$, a gate of the fourteenth transistor M14 and a gate of the fifteenth transistor M15 are both electrically connected to the first output terminal of the driver branch 110, a drain of the fourteenth transistor M14 is electrically connected to the control terminal of the to-be-driven switch Q, and a drain of the fifteenth transistor M15 is electrically connected to the control terminal of the eighth transistor M8.

In a case where the to-be-driven switch Q is in the turned-off state, the driver branch 110 may generate a turn-on control signal Driver_on_z1 based on the turn-on drive signal Driver_on, and output the turn-on control signal Driver_on_z1 to the gate of the fourteenth transistor M14 and the gate of the fifteenth transistor M15 via the first output terminal thereof. Under the effect of the turn-on control signal Driver_on_z1, the fourteenth transistor M14 and the fifteenth transistor M15 are turned on, that is, the control terminal of the to-be-driven switch Q may be electrically connected to the predetermined voltage $V_{CP}$, and meanwhile the control terminal of the eighth transistor M8 may be electrically connected to the predetermined voltage $V_{CP}$.

By electrical connection between the control terminal of the eighth transistor M8 and the predetermined voltage $V_{CP}$, a voltage at the control terminal of the eighth transistor M8 may be pulled up, such that the eighth transistor M8 is turned off, and hence the control terminal of the to-be-driven switch Q is electrically disconnected from the voltage $V_{OUT}$ of the load. Meanwhile, by electrical connection between the control terminal of the to-be-driven switch Q and the predetermined voltage $V_{CP}$, the voltage at the control terminal of the to-be-driven switch Q is quickly pulled up, such that the to-be-driven switch Q is quickly turned on.

As such, the pull-up circuit 127 may, based on the turn-on control signal Driver_on_z1, electrically connect the control terminal of the to-be-driven switch Q to the predetermined voltage $V_{CP}$, and meanwhile electrically connect the control terminal of the eighth transistor M8 to the predetermined voltage $V_{CP}$.

In the embodiments of the present disclosure, the auxiliary driver branch includes a pull-up circuit. The control terminal of the to-be-driven switch is electrically connected to the first output terminal of the pull-up circuit, the control terminal of the eighth transistor is electrically connected to the second output terminal of the pull-up circuit, the control terminal of the pull-up circuit is electrically connected to the first output terminal of the driver branch, and the input terminal of the pull-up circuit is electrically connected to the predetermined voltage. By the pull-up circuit, based on the turn-on control signal, the control terminal of the to-be-driven switch may be electrically connected to the predetermined voltage, and meanwhile the control terminal of the eighth transistor may be electrically connected to the predetermined voltage, such that the voltage at the control terminal of the to-be-driven switch is quickly pulled up, and hence the to-be-driven switch is quickly turned on.

In some embodiments, still referring to FIG. 4 to FIG. 6 and FIG. 9 to FIG. 14, the switch driver circuit 100 further includes a floating power supply branch. An input terminal of the floating power supply branch is electrically connected to the predetermined voltage $V_{CP}$, and a ground terminal of the floating power supply branch is electrically connected to the second terminal of the to-be-driven switch Q.

For example, as illustrated in FIG. 4 to FIG. 6 and FIG. 9 to FIG. 14, the floating power supply branch includes a third current source IB3, a sixth clamp assembly, a sixth capacitor C6, a sixteenth transistor M16, and a first enable switch $K_{EN1}$. The predetermined voltage $V_{CP}$ is electrically connected to an input terminal of the third current source IB3 and a first terminal of the sixteenth transistor M16, an output terminal of the third current source IB3 is electrically connected to a first terminal of the first enable switch $K_{EN1}$, a second terminal of the first enable switch $K_{EN1}$ is electrically connected to a control terminal of the sixteenth transistor M16, a first terminal of the sixth clamp assembly and a first plate of the sixth capacitor C6, a second terminal of the sixteenth transistor M16 is electrically connected to a power terminal of the falling edge delayer FDLY and a power terminal of the second inverter 112, and a second terminal of the sixth clamp assembly is electrically connected to a second plate of the sixth capacitor C6, the falling edge delayer FDLY, a ground terminal of the second inverter 112 and the second terminal of the to-be-driven switch Q.

Specifically, as illustrated in FIG. 4 to FIG. 6 and FIG. 9 to FIG. 14, the sixteenth transistor M16 is an N-type MOS transistor. A source of the sixteenth transistor M16 is electrically connected to the power terminal of the falling edge delayer FDLY and the power terminal of the second inverter 112, a drain of the sixteenth transistor M16 is electrically connected to the predetermined voltage $V_{CP}$, and a gate of the sixteenth transistor M16 is electrically connected to the second terminal of the first enable switch $K_{EN1}$.

In a case where the first enable switch $K_{EN1}$ is closed, that is, the first enable switch $K_{EN1}$ is turned on, and the first enable switch $K_{EN1}$ is enabled, an output current $I_{B3}$ of the third current source IB3 flows through the sixth clamp assembly to generate a sixth clamp voltage $V_{z6}$. In this case, the sixteenth transistor M16 is in a turned-on state, the current provided by the predetermined voltage $V_{CP}$ flows through the sixteenth transistor M16 to generate a floating power supply HVDD, and the floating power supply HVDD is provided to the falling edge delayer FDLY and the second inverter 112. As such, the floating power supply branch may provide a floating power supply HVDD to the driver branch 110.

It should be noted that FIG. 4 to FIG. 6 and FIG. 9 to FIG. 14 merely for example illustrate a circuit structure of the floating power supply branch capable of generating the floating power supply HVDD. However, the structure of the floating power supply branch is not limited hereto.

For example, the sixth clamp assembly may be a Zener diode. For example, as illustrated in FIG. 4 to FIG. 6 and FIG. 9 to FIG. 14, the sixth clamp assembly includes an eighth Zener diode Dz8. A cathode of the eighth Zener diode Dz8 is electrically connected to the control terminal of the sixteenth transistor M16, and an anode of the eighth Zener diode Dz8 is electrically connected to the second terminal of the to-be-driven switch Q.

In some other embodiments, the sixth clamp assembly may be a plurality of diodes that are connected in series and forwardly turned on, or may be a device that generates a fixed voltage based on a current flowing through. The type of the sixth clamp assembly is not specifically limited in the embodiments of the present disclosure.

It should be noted that in the embodiments of the present disclosure, the sixth clamp assembly is described using one Zener diode as an example, and the number of Zener diodes in the sixth clamp assembly is not limited. In practical applications, the number of Zener diodes may be determined based on a breakdown voltage of the Zener diodes and a withstand voltage of a gate-source voltage $V_{GS16}$ of the sixteenth transistor M16.

In some embodiments, still referring to FIG. 4 to FIG. 6 and FIG. 9 to FIG. 14, the switch driver circuit 100 further includes a floating ground branch. An input terminal of the floating ground branch is electrically connected to the predetermined voltage $V_{CP}$, and a ground terminal of the floating ground branch is electrically is grounded.

For example, as illustrated in FIG. 4 to FIG. 6 and FIG. 9 to FIG. 14, the floating ground branch includes a fourth current source IB4, a seventh clamp assembly, a seventh capacitor C7, a seventeenth transistor M17, and a second enable switch $K_{EN2}$. The predetermined voltage $V_{CP}$ is electrically connected to a first terminal of the seventh clamp assembly, a first plate of the seventh capacitor C7, a power terminal of the rising edge delayer RDLY and a power terminal of the first inverter 111, a second terminal of the seventh clamp assembly is electrically connected to a second plate of the seventh capacitor C7, a control terminal of the seventeenth transistor M17 and a first terminal of the second enable switch $K_{EN2}$, a second terminal of the second enable switch $K_{EN2}$ is electrically connected to an input terminal of the fourth current source IB4, a first terminal of the seventeenth transistor M17 is electrically connected to a ground terminal of the rising edge delayer RDLY and a ground terminal of the first inverter 111, and an output terminal of the seventeenth transistor M17 and an output terminal of the fourth current source IB4 are both grounded.

Specifically, as illustrated in FIG. 4 to FIG. 6 and FIG. 9 to FIG. 14, the seventeenth transistor M17 is a P-type MOS transistor. A source of the seventeenth transistor M17 is electrically connected to the ground terminal of the rising edge delayer RDLY, and the ground terminal of the first inverter 111, a drain of the seventeenth transistor M17 is grounded, and a gate of the seventeenth transistor M17 is electrically connected to the first terminal of the second enable switch $K_{EN2}$.

In a case where the second enable switch $K_{EN2}$ is closed, that is, the second enable switch $K_{EN2}$ is turned on, and the enable switch $K_{EN2}$ is enabled, the current provided by the predetermined voltage $V_{CP}$ flows through the seventh clamp assembly to generate a seventh clamp voltage $V_{z7}$. In this case, the seventeenth transistor M17 is in a turned-on state, the current provided by the predetermined voltage $V_{CP}$ flows through the seventeenth transistor M17 to generate a floating ground HVSS, and the floating ground HVSS is provided to the ground terminal of the rising edge delayer RDLY and the first inverter 111. As such, the floating ground branch may provide a floating ground HVSS to the driver branch 110.

It should be noted that FIG. 4 to FIG. 6 and FIG. 9 to FIG. 14 merely for example illustrate a circuit structure of the floating ground branch capable of generating the floating ground HVSS. However, the structure of the floating ground branch is not limited hereto.

For example, the seventh clamp assembly may be a Zener diode. For example, as illustrated in FIG. 4 to FIG. 6 and FIG. 9 to FIG. 14, the seventh clamp assembly includes a ninth Zener diode Dz9. A cathode of the ninth Zener diode Dz9 is electrically connected to the predetermined voltage $V_{CP}$, and an anode of the ninth Zener diode Dz9 is electrically connected to the gate of the seventeenth transistor M17.

In some other embodiments, the seventh clamp assembly may be a plurality of diodes that are connected in series and forwardly turned on, or may be a device that generates a fixed voltage based on a current flowing through. The type of the seventh clamp assembly is not specifically limited in the embodiments of the present disclosure.

It should be noted that in the embodiments of the present disclosure, the seventh clamp assembly is described using one Zener diode as an example, and the number of Zener diodes in the seventh clamp assembly is not limited. In practical applications, the number of Zener diodes may be determined based on a breakdown voltage of the Zener diodes and a withstand voltage of a gate-source voltage $V_{GS17}$ of the seventeenth transistor M17.

Figure 15:
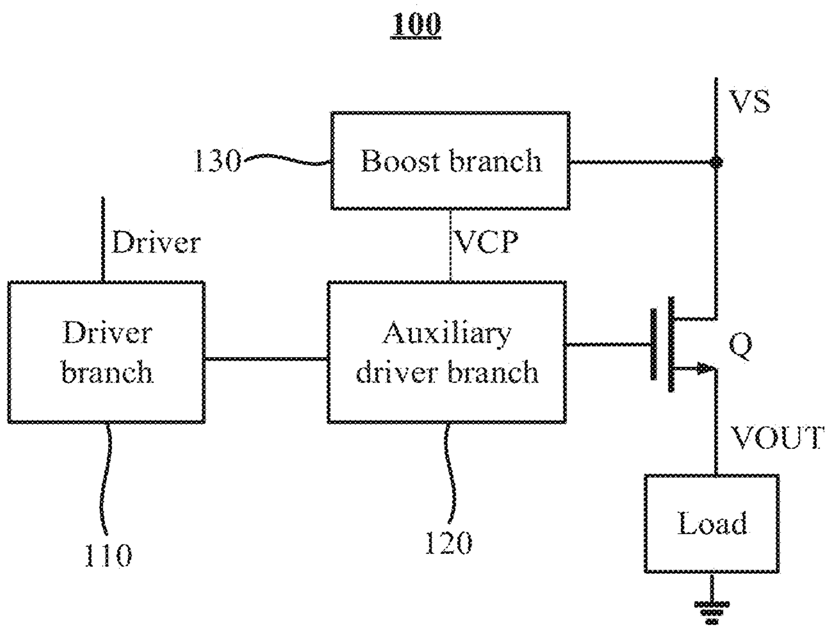
FIG. 15 is a schematic structural diagram of a switch driver circuit according to some embodiments of the present disclosure.

In some other embodiments, FIG. 15 is a schematic structural diagram of a switch driver circuit according to some embodiments of the present disclosure. As illustrated in FIG. 15, based on the embodiments illustrated in FIG. 3, the switch driver circuit 100 further includes a boost circuit 130. An input terminal of the boost circuit 130 is electrically connected to the power supply voltage VS, and an output terminal of the boost circuit 130 is electrically connected to the input terminal of the auxiliary driver branch 120.

The boost branch 130 is configured to boost the power supply voltage VS to the predetermined voltage $V_{CP}$.

For example, the to-be-driven switch Q may be a power transistor, which requires a larger gate-source voltage $V_{GS}$, typically, $V_{GS}$>10 V. However, the power supply voltage VS is typically 3.3 V or 5 V. Therefore, a boost branch 130 may be arranged before the input terminal of the auxiliary driver circuit 120. The boost branch 130 may boost the power supply voltage VS, such that a predetermined voltage $V_{CP}$ is acquired, wherein $V_{CP}$>VS+10 V.

The boost branch 130 may be a charge pump, for example, a double boost charge pump, a three times boost charge pump, or a four times boost charge pump. A suitable charge pump may be specifically selected based on the power supply voltage VS and the gate-source voltage $V_{GS}$ of the to-be-driven switch Q.

Some embodiments of the present disclosure provide a switch circuit. The switch circuit includes a to-be-driven switch and the switch driver circuit according to any of the above embodiments.

Figure 16:
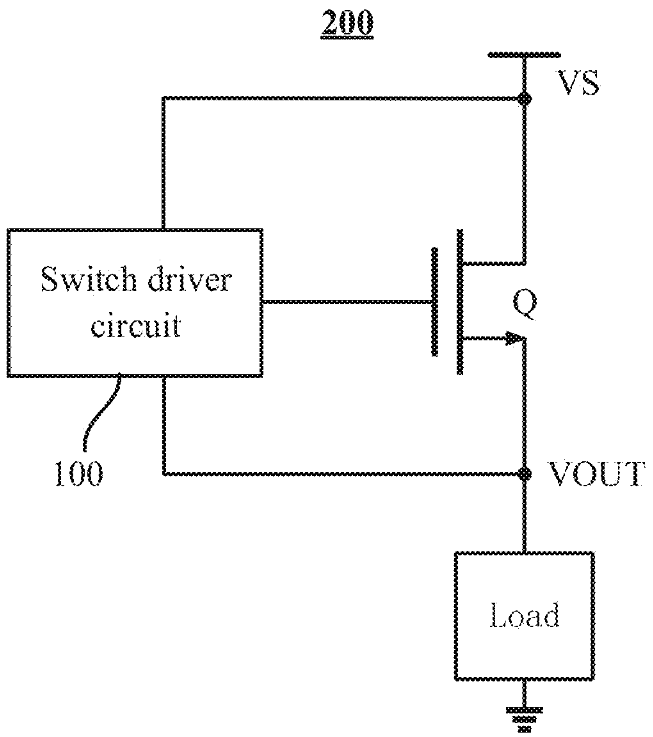
FIG. 16 is a schematic structural diagram of a switch circuit according to some embodiments of the present disclosure.

FIG. 16 is a schematic structural diagram of a switch circuit 200 according to some embodiments of the present disclosure. As illustrated in FIG. 16, the switch circuit 200 includes a to-be-driven switch Q and a switch driver circuit 100.

For example, the control terminal of the to-be-driven switch Q is electrically connected to an output terminal of the switch driver circuit 100, a ground terminal of the switch driver circuit 100 is electrically connected to the second terminal of the to-be-driven switch Q and an input terminal of a load 20, the first terminal of the to-be-driven switch Q is electrically connected to the power supply voltage VS, and an output terminal of the load 20 is grounded.

The switch circuit according to the embodiments of the present disclosure includes the switch driver circuit according to any of the above embodiments, which has the same functional modules and achieves the same beneficial effects as the switch driver circuit as described above, which are thus not described herein any further.

Some embodiments of the present disclosure provide a chip. The chip includes the switch driver circuit according to any of the above embodiments, or the switch circuit according to the above embodiments.

The chip according to the embodiments of the present disclosure includes the switch driver circuit according to any of the above embodiments, or the switch circuit according to the above embodiments, which has the same functional modules and achieves the same beneficial effects as the switch driver circuit as described above, which are thus not described herein any further.

In the description of the present disclosure, the term "comprise" or "include" does not exclude the presence of an element or a step not listed in claims. The article "a" or "an" used before an element does not exclude the presence of a plurality of such elements. The present disclosure may be implemented by means of a hardware including several distinct elements and by means of a suitably programmed computer. In a unit claim enumerating several devices, several of the devices may be embodied by one and the same hardware item. Use of the terms "first," "second," "third," and the like does not mean any ordering, and may be interpreted as parts of naming. The steps in the above embodiments, unless otherwise specified, shall not be understood as causing limitations to the execution order.

Therefore, it should be finally noted that the above-described embodiments are merely for illustration of the present disclosure, but are not intended to limit the present disclosure. Although the present disclosure is described in detail with reference to these embodiments, a person skilled in the art may also make various modifications to the technical solutions disclosed in the embodiments, or make equivalent replacements to a part of the technical features contained therein. Such modifications or replacements, made without departing from the principles of the present disclosure, shall fall within the scope of the present disclosure.

What is claimed is:

1. A switch driver circuit, comprising: a driver branch, and an auxiliary driver branch; wherein an input terminal of the driver branch is electrically connected to a drive signal, an output terminal of the driver branch is electrically connected to a control terminal of the auxiliary driver branch, an input terminal of the auxiliary driver branch is electrically connected to a predetermined voltage, an output terminal of the auxiliary driver branch is electrically connected to and a control terminal of a to-be-driven switch, wherein a first terminal of the to-be-driven switch is electrically connected to a power supply voltage, and a second terminal of the to-be-driven switch is grounded via a load;

the driver branch is configured to generate a control signal for the auxiliary driver branch based on the drive signal; and the auxiliary driver branch is configured to control, based on the control signal, the to-be-driven switch to switch from a first state to a second state within a predetermined time.

2. The switch driver circuit according to claim 1, wherein the auxiliary driver branch comprises a turn-on auxiliary driver circuit, wherein a control terminal of the turn-on auxiliary driver circuit is electrically connected to a first output terminal of the driver branch, an input terminal of the turn-on auxiliary driver circuit is electrically connected to the predetermined voltage, and an output terminal of the turn-on auxiliary driver circuit is electrically connected to the control terminal of the to-be-driven switch;

the driver branch is configured to generate a turn-on control signal based on a turn-on drive signal; and the turn-on auxiliary driver circuit is configured to control, based on the turn-on control signal, the to-be-driven switch to switch from a turned-off state to a turned-on state.

3. The switch driver circuit according to claim 2, wherein the turn-on auxiliary driver circuit comprises a pull-up current source, a first current source, a first capacitor, a second capacitor, a first transistor, a second transistor, a third transistor, a fourth transistor, and a first clamp assembly;

wherein the predetermined voltage is electrically connected to an input terminal of the pull-up current source, an input terminal of the first current source, a first plate of the first capacitor and a first terminal of the third transistor, an output terminal of the pull-up current source is electrically connected to a first terminal of the first transistor, an output terminal of the first current source is electrically connected to a first terminal of the second transistor, a second terminal of the second transistor is electrically connected to a first terminal of the first clamp assembly, a second plate of the first capacitor, a first plate of the second capacitor and a control terminal of the fourth transistor, a second terminal of the third transistor is electrically connected to a first terminal of the fourth transistor, a second terminal of the first transistor is electrically connected to a second terminal of the first clamp assembly, a second plate of the second capacitor, a second terminal of the fourth transistor and the control terminal of the to-be-driven switch, and a control terminal of the first transistor, a control terminal of the second transistor and a control terminal of the third transistor are electrically connected to the first output terminal of the driver branch.

4. The switch driver circuit according to claim 3, wherein the auxiliary driver branch further comprises a first resistor, a first terminal of the first resistor is electrically connected to the control terminal of the fourth transistor, and a second terminal of the first resistor is electrically connected to the control terminal of the to-be-driven switch.

5. The switch driver circuit according to claim 1, wherein the auxiliary driver branch comprises a turn-off auxiliary driver circuit, wherein a control terminal of the turn-off auxiliary driver circuit is electrically connected to a second output terminal of the driver branch, an input terminal of the turn-off auxiliary driver circuit is electrically connected to the control terminal of the to-be-driven switch, and an output terminal of the turn-off auxiliary driver circuit is electrically connected to the second terminal of the to-be-driven switch;

the driver branch is configured to generate a turn-off control signal based on a turn-off drive signal; and the turn-off auxiliary driver circuit is configured to control, based on the turn-off control signal, the to-be-driven switch to switch from a turned-on state to a turned-off state at a second predetermined time.

6. The switch driver circuit according to claim 5, wherein the turn-off auxiliary driver circuit comprises a pull-down current source, a second current source, a third capacitor, a fourth capacitor, a fifth transistor, a sixth transistor, a seventh transistor, an eighth transistor, and a second clamp assembly;

wherein the control terminal of the to-be-driven switch is electrically connected to a first terminal of the eighth transistor, a first plate of the third capacitor, a first terminal of the second clamp assembly and a first terminal of the fifth transistor, a second terminal of the second clamp assembly is electrically connected to a first terminal of the sixth transistor, a second plate of the third capacitor, a first plate of the fourth capacitor and a control terminal of the eighth transistor, a second terminal of the eighth transistor is electrically connected to a first terminal of the seventh transistor, a second terminal of the fifth transistor is electrically connected to an input terminal of the pull-down current source, a second terminal of the sixth transistor is electrically connected to an input terminal of the second current source, a second terminal of the seventh transistor is electrically connected to an output terminal of the pull-down current source, an output terminal of the second current source, a second plate of the fourth capacitor and a second terminal of the to-be-driven switch, and a control terminal of the fifth transistor, a control terminal of the sixth transistor and a control terminal of the seventh transistor are electrically connected to the second output terminal of the driver branch.

7. The switch driver circuit according to claim 6, wherein the auxiliary driver branch further comprises a second resistor, wherein a first terminal of the second resistor is electrically connected to the control terminal of the to-be-driven switch, and a second terminal of the second resistor is electrically connected to the control terminal of the eighth transistor.

8. The switch driver circuit according to claim 3, wherein the auxiliary driver branch further comprises a pull-down circuit; wherein a first input terminal of the pull-down circuit is electrically connected to the control terminal of the to-be-driven switch, a second input terminal of the pull-down circuit is electrically connected to the control terminal of the fourth transistor, an output terminal of the pull-down circuit is electrically connected to the second terminal of the to-be-driven switch, and a control terminal of the pull-down circuit is electrically connected to the second output terminal of the driver branch; and the pull-down circuit is configured to, based on the turn-off control signal, electrically connect the control terminal of the to-be-driven switch to the second terminal of the to-be-driven switch, and meanwhile electrically connect the control terminal of the fourth transistor to the second terminal of the to-be-driven switch.

9. The switch driver circuit according to claim 3, wherein the auxiliary driver branch further comprises a protection circuit; wherein a first input terminal of the protection circuit is electrically connected to the predetermined voltage, a second input terminal of the protection circuit is electrically connected to the power supply voltage, a third input terminal of the protection circuit is electrically connected to the control terminal of the to-be-driven switch, a fourth input terminal of the protection circuit is electrically connected to the control terminal of the fourth transistor, a control terminal of the protection circuit is electrically connected to a third output terminal of the driver branch, and an output terminal of the protection circuit is electrically connected to the second terminal of the to-be-driven switch; and the protection circuit is configured to control the to-be-driven switch to be constantly in the turned-off state in response to a jump of the power supply voltage and/or the predetermined voltage.

10. The switch driver circuit according to claim 9, wherein the protection circuit comprises a third resistor, a fourth resistor, a fifth resistor, an eleventh transistor, a twelfth transistor, and a thirteenth transistor, a fifth capacitor, and a third clamp assembly; wherein a control terminal of the eleventh transistor is electrically connected to the third output terminal of the driver branch and a first terminal of the third resistor, a first terminal of the eleventh transistor is electrically connected to a first plate of the fifth capacitor, a first terminal of the third clamp assembly, a first terminal of the fourth resistor, a first terminal of the fifth resistor, a control terminal of the twelfth transistor and a control terminal of the thirteenth transistor, a first terminal of the twelfth transistor is electrically connected to a control terminal of the fourth transistor, a first terminal of the thirteenth transistor is electrically connected to the control terminal of the to-be-driven switch, a second terminal of the fourth resistor is electrically connected to the predetermined voltage, and a second terminal of the fifth resistor is electrically connected to the power supply voltage; and a second terminal of the third resistor is electrically connected to a second terminal of the eleventh transistor, a second plate of the fifth capacitor, a second terminal of the third clamp assembly, a second terminal of the twelfth transistor, a second terminal of the thirteenth transistor and the second terminal of the to-be-driven switch.

11. The switch driver circuit according to claim 3, wherein the auxiliary driver branch further comprises a first clamp circuit and a second clamp circuit; wherein an input terminal of the first clamp circuit is electrically connected to the control terminal of the fourth transistor, an input terminal of the second clamp circuit is electrically connected to the control terminal of the to-be-driven switch, and an output terminal of the first clamp circuit and an output terminal of the second clamp circuit are both electrically connected to the second terminal of the to-be-driven switch;

the first clamp circuit is configured to clamp a voltage between the control terminal of the fourth transistor and the second terminal of the to-be-driven switch in a case where a voltage of the load is less than the predetermined voltage; and the second clamp circuit is configured to clamp a voltage between the control terminal of the to-be-driven switch and the second terminal of the to-be-driven switch in a case where the voltage of the load is less than the predetermined voltage.

12. The switch driver circuit according to claim 11, wherein the first clamp circuit comprises a fourth clamp assembly and a sixth resistor, wherein a first terminal of the fourth clamp assembly is electrically connected to the control terminal of the fourth transistor, a second terminal of the fourth clamp assembly is electrically connected to a first terminal of the sixth resistor, and a second terminal of the sixth resistor is electrically connected to the second terminal of the to-be-driven switch; and the second clamp circuit comprises a fifth clamp assembly and a seventh resistor, wherein a first terminal of the fifth clamp assembly is electrically connected to the control terminal of the to-be-driven switch, a second terminal of the fifth clamp assembly is electrically connected to a first terminal of the seventh resistor, and a second terminal of the seventh resistor is electrically connected to the second terminal of the to-be-driven switch.

13. The switch driver circuit according to claim 1, wherein the auxiliary driver branch comprises a pull-up circuit and a turn-off auxiliary driver circuit; wherein the turn-off auxiliary driver circuit comprises a pull-down current source, a second current source, a third capacitor, a fourth capacitor, a fifth transistor, a sixth transistor, a seventh transistor, an eighth transistor, and a second clamp assembly;

wherein the control terminal of the to-be-driven switch is electrically connected to a first terminal of the eighth transistor, a first plate of the third capacitor, a first terminal of the second clamp assembly, a first terminal of the fifth transistor and a first output terminal of the pull-up circuit, a second terminal of the second clamp assembly is electrically connected to a first terminal of the sixth transistor, a second plate of the third capacitor, a first plate of the fourth capacitor, a control terminal of the eighth transistor and a second output terminal of the pull-up circuit, a second terminal of the eighth transistor is electrically connected to a first terminal of the seventh transistor, a second terminal of the fifth transistor is electrically connected to an input terminal of the pull-down current source, a second terminal of the sixth transistor is electrically connected to an input terminal of the second current source, a second terminal of the seventh transistor is electrically connected to an output terminal of the pull-down current source, an output terminal of the second current source, a second plate of the fourth capacitor, and the second terminal of the to-be-driven switch, a control terminal of the pull-up circuit is electrically connected to a first output terminal of the driver circuit, and an input terminal of the pull-up circuit is electrically connected to the predetermined voltage;

the driver branch is configured to generate a turn-off control signal based on a turn-off drive signal, and generate a turn-on control signal based on a turn-on drive signal;

the turn-off auxiliary driver circuit is configured to control, based on the turn-off control signal, the to-be-driven switch to switch from a turned-on state to a turned-off state at a second predetermined time; and the pull-up circuit is configured to, based on the turn-on control signal, electrically connect the control terminal of the to-be-driven switch to the predetermined voltage, and meanwhile electrically connect the control terminal of the eighth transistor to the predetermined voltage.

14. The switch driver circuit according to claim 13, wherein the pull-up circuit comprises a fourteenth transistor and a fifteenth transistor;

wherein the predetermined voltage is electrically connected to a first terminal of the fourteenth transistor and a first terminal of the fifteenth transistor, a second terminal of the fourteenth transistor is electrically connected to the control terminal of the to-be-driven switch, a second terminal of the fifteenth transistor is electrically connected to the control terminal of the eighth transistor, and a control terminal of the fourteenth transistor and a control terminal of the fifteenth transistor are both electrically connected to the first output terminal of the driver branch.

15. The switch driver circuit according to claim 1, wherein the driver branch comprises a first level converter, a second level converter, a rising edge delayer, a falling edge delayer, a first inverter, and a second inverter;

wherein an input terminal of the first level converter and an input terminal of the second level converter are electrically connected to the drive signal, an output terminal of the first level converter is electrically connected to an input terminal of the rising edge delayer, an output terminal of the second level converter is electrically connected to an input terminal of the falling edge delayer, an output terminal of the rising edge delayer is electrically connected to an input terminal of the first inverter, an output terminal of the falling edge delayer is electrically connected to an input terminal of the second inverter, an output terminal of the first inverter is electrically connected to a first output terminal of the driver branch, and an output terminal of the second inverter is electrically connected to a second output terminal of the driver branch.

16. The switch driver circuit according to claim 15, further comprising: a floating power supply branch; wherein an input terminal of the floating power supply branch is electrically connected to the predetermined voltage, and a ground terminal of the floating power supply branch is electrically connected to the second terminal of the to-be-driven switch; and the floating power supply branch is configured to provide a floating power supply to the driver branch.

17. The switch driver circuit according to claim 16, wherein the floating power supply branch comprises a third current source, a sixth clamp assembly, a sixth capacitor, a sixteenth transistor, and a first enable switch;

wherein the predetermined voltage is electrically connected to an input terminal of the third current source and a first terminal of the sixteenth transistor, an output terminal of the third current source is electrically connected to a first terminal of the first enable switch, a second terminal of the first enable switch is electrically connected to a control terminal of the sixteenth transistor, a first terminal of the sixth clamp assembly and a first plate of the sixth capacitor, a second terminal of the sixteenth transistor is electrically connected to a power terminal of the falling edge delayer and a power terminal of the second inverter, and a second terminal of the sixth clamp assembly is electrically connected to a second plate of the sixth capacitor, the falling edge delayer, a ground terminal of the second inverter and the second terminal of the to-be-driven switch.

18. The switch driver circuit according to claim 15, further comprising: a floating ground branch; wherein an input terminal of the floating ground branch is electrically connected to the predetermined voltage, and a ground terminal of the floating ground branch is grounded; and the floating ground branch is configured to provide a floating ground to the driver branch.

19. The switch driver circuit according to claim 18, wherein the floating ground branch comprises a fourth current source, a seventh clamp assembly, a seventh capacitor, a seventeenth transistor, and a second enable switch;

wherein the predetermined voltage is electrically connected to a first terminal of the seventh clamp assembly, a first plate of the seventh capacitor, a power terminal of the rising edge delayer and a power terminal of the first inverter, a second terminal of the seventh clamp assembly is electrically connected to a second plate of the seventh capacitor, a control terminal of the seventeenth transistor and a first terminal of the second enable switch, a second terminal of the second enable switch is electrically connected to an input terminal of the fourth current source, a first terminal of the seventeenth transistor is electrically connected to a ground terminal of the rising edge delayer and a ground terminal of the first inverter, and an output terminal of the seventeenth transistor and an output terminal of the fourth current source are both grounded.

20. A chip, comprising: a switch driver circuit, wherein the switch driver circuit comprises: a driver branch, and an auxiliary driver branch;

an input terminal of the driver branch is electrically connected to a drive signal, an output terminal of the driver branch is electrically connected to a control terminal of the auxiliary driver branch, an input terminal of the auxiliary driver branch is electrically connected to a predetermined voltage, an output terminal of the auxiliary driver branch is electrically connected to and a control terminal of a to-be-driven switch, wherein a first terminal of the to-be-driven switch is electrically connected to a power supply voltage, and a second terminal of the to-be-driven switch is grounded via a load;

the driver branch is configured to generate a control signal for the auxiliary driver branch based on the drive signal; and the auxiliary driver branch is configured to control, based on the control signal, the to-be-driven switch to switch from a first state to a second state within a predetermined time.

* * * * *